US006971197B1

(12) United States Patent  
Seiber et al.

(10) Patent No.: US 6,971,197 B1  
(45) Date of Patent: Dec. 6, 2005

(54) DISPLAY BOARD SYSTEM

(75) Inventors: Charles Anthony Seiber, Atherton, CA (US); Robert Peter Arko, Palo Alto, CA (US); Otto Daniel DeRuntz, Dunstable, MA (US); William Charles Stewart, Providence, RI (US); Steven Ryutaro Takayama, Atherton, CA (US); Frank Friedman, Mill Valley, CA (US); Kristine Rene Chan-Lizardo, Redwood City, CA (US)

(73) Assignee: Steelcase Development Corporation, Grand Rapids, MI (US)

( * ) Notice: Subject to any disclaimer, the term of this patent is extended or adjusted under 35 U.S.C. 154(b) by 415 days.

(21) Appl. No.: 09/669,913

(22) Filed: Sep. 25, 2000

Related U.S. Application Data

(63) Continuation-in-part of application No. 09/182,999, filed on Oct. 30, 1998, now Pat. No. 6,272,779.

(51) Int. Cl.⁷ .............................................. G06F 15/00
(52) U.S. Cl. .................... 40/606.01; 40/530; 40/606.15
(58) Field of Search ........................ 40/606.01, 606.14, 40/606.15, 606.16, 606, 617, 530, 533, 535

(56) References Cited

U.S. PATENT DOCUMENTS

| 119,054 A | 9/1871 | Shryock |
| 124,334 A | 3/1872 | Bayly |
| 236,610 A | * 1/1881 | Moon .......................... 281/43 |
| 241,600 A | 5/1881 | Bray |
| 241,925 A | 5/1881 | Cadwell |
| 249,198 A | 11/1881 | Moon |
| 253,538 A | 2/1882 | McLane |
| 454,844 A | 6/1891 | Brewerton et al. |
| 475,126 A | 5/1892 | Lorenz |

(Continued)

FOREIGN PATENT DOCUMENTS

| AT | 164466 | 4/1949 |
| DE | 232680 | 8/1963 |
| DE | 1561580 | 4/1970 |
| GB | 124334 | 4/1949 |
| JP | 0093944 | 4/1991 |
| JP | 0093946 | 4/1991 |
| JP | 3-93944 | 4/1991 |
| JP | 3-93946 | 4/1991 |
| JP | 404222787 | 8/1992 |
| WO | WO 95/24031 | 9/1995 |

OTHER PUBLICATIONS

US 5,252,368, 10/1993, Blake (withdrawn)

Promotional Materials for "A World of Possibilities Introducing Contrada(TM), The Next Generatation in Office Furniture", By Trendway Corporation of Holland, Michigan, bearing a designation "(C)1998".

Promotional Materials for "Village Wall" by Tellus Furniture a Paoli Company of Orleans, Indiana, bearing a designation "(C)1998 Tellus Furniture", 8 color sheets.

Yate, JoAnne, "Graphic ROI Reporting," Knowledge Management at 106, Oct. 1998.

(Continued)

*Primary Examiner*—William L. Miller  
(74) *Attorney, Agent, or Firm*—Quarles & Brady LLP

(57) ABSTRACT

A mounting structure including at least one display board including a first mounting interface and a second mounting interface, a first pivotal interface including a first projection forming a retaining slot adapted to engage the first mounting interface of the display board wherein the first projection is a hook and the second pivotal interface adapted to engage the second mounting interface of the display board so that the display board is adapted to be removably pivotally coupled to the mounting structure at both the first pivotal interface and the second pivotal interface.

21 Claims, 27 Drawing Sheets

U.S. PATENT DOCUMENTS

| | | | |
|---|---|---|---|
| 549,347 A | 11/1895 | Clark | |
| 605,148 A | 6/1898 | Sylverster | |
| 621,835 A | 3/1899 | MacDonald | |
| 627,396 A | 6/1899 | Daly | |
| 713,417 A | 11/1902 | Feldman et al. | |
| 742,979 A * | 11/1903 | Flamagen | 40/535 |
| 821,144 A | 5/1906 | Walsh | |
| 928,292 A * | 7/1909 | Walsh | 211/96 |
| 943,821 A | 12/1909 | Feldman, Jr. | |
| 950,006 A | 2/1910 | McCarty | |
| 955,586 A | 4/1910 | Emerich | |
| 997,866 A | 7/1911 | Smith | |
| 1,026,561 A * | 5/1912 | Charlet | 40/533 |
| 1,086,236 A | 2/1914 | Staples | |
| 1,116,484 A | 11/1914 | Ralph | |
| 1,122,926 A | 12/1914 | Hick | |
| 1,141,404 A | 6/1915 | Moseley | |
| 1,203,659 A | 11/1916 | Smith | |
| 1,254,036 A | 1/1918 | Grant | |
| 1,323,982 A * | 12/1919 | Hedrick | 40/535 |
| 1,326,832 A | 12/1919 | Baily | |
| 1,457,990 A | 6/1923 | Morgan | |
| 1,467,476 A * | 9/1923 | Farver | 16/365 |
| 1,599,888 A | 9/1926 | Haskell | |
| 1,616,897 A | 2/1927 | Hayes | |
| 1,688,456 A | 10/1928 | Dolph | |
| 1,770,755 A | 7/1930 | Kleimpell | |
| 1,826,469 A | 10/1931 | Hunt et al. | |
| 1,843,629 A | 2/1932 | Schwartz | |
| 1,881,636 A | 10/1932 | Johnson et al. | |
| 1,887,539 A | 11/1932 | Brown | |
| 1,943,629 A | 1/1934 | Schwartz | |
| 1,958,579 A | 5/1934 | Johnson et al. | |
| 1,997,829 A | 4/1935 | McKee | |
| 2,070,408 A | 2/1937 | Leidgen | |
| 2,144,083 A | 1/1939 | Rentfrow, Sr. | |
| 2,348,414 A | 5/1944 | Pierce | |
| 2,691,238 A | 10/1954 | Svatos | |
| 2,795,067 A | 6/1957 | Walker | |
| 2,812,067 A | 11/1957 | Gussack | |
| 2,886,182 A | 5/1959 | Dauman | |
| 2,870,459 A | 7/1959 | Zabielski | |
| 2,914,873 A | 12/1959 | Brennan | |
| 2,928,555 A * | 3/1960 | Childs et al. | 211/169 |
| 2,963,332 A | 12/1960 | Breuning | |
| 3,017,999 A | 1/1962 | Cano | |
| 3,042,978 A | 7/1962 | Eames et al. | |
| 3,060,521 A | 10/1962 | Greco | |
| 3,078,133 A | 2/1963 | Schauer | |
| 3,141,207 A | 7/1964 | Kahler | |
| 3,181,274 A | 5/1965 | Izenour | |
| 3,251,477 A | 5/1966 | Parstorfer | |
| 3,286,382 A | 11/1966 | Newman | |
| 3,351,211 A | 11/1967 | Best | |
| 3,374,794 A * | 3/1968 | Reed | 206/225 |
| 3,391,796 A | 7/1968 | Cross | |
| 3,412,868 A | 11/1968 | Carter | |
| 3,425,568 A | 2/1969 | Albright | |
| 3,514,883 A | 6/1970 | Albright | |
| 3,557,499 A | 1/1971 | Dickie et al. | |
| 3,581,423 A | 6/1971 | Mascolo | |
| 3,643,362 A | 2/1972 | Hackett et al. | |
| 3,646,696 A | 3/1972 | Sarkisian | |
| 3,683,100 A | 8/1972 | Deal et al. | |
| 3,732,633 A | 5/1973 | Margolis et al. | |
| 3,760,952 A | 9/1973 | White | |
| 3,777,896 A | 12/1973 | Ehrlich | |
| 3,797,146 A | 3/1974 | Holes | |
| 3,857,731 A | 12/1974 | Merrill, Jr. et al. | |
| 3,883,972 A | 5/1975 | Propst et al. | |
| 3,921,320 A | 11/1975 | McWilliams | |
| 3,924,749 A | 12/1975 | Weston | |
| 3,936,968 A | 2/1976 | Gilbert | |
| 3,952,133 A | 4/1976 | Amos et al. | |
| 3,975,837 A | 8/1976 | Baars | |
| 3,984,930 A | 10/1976 | Booland | |
| 4,033,058 A | 7/1977 | Lyman | |
| 4,083,137 A | 4/1978 | Rozmanith | |
| 4,135,775 A | 1/1979 | Driscoll | |
| 4,166,332 A | 9/1979 | Donovan | |
| 4,175,154 A | 11/1979 | Faust et al. | |
| 4,180,298 A | 12/1979 | Borgerson, Jr. | |
| 4,194,313 A | 3/1980 | Downing | |
| 4,239,170 A | 12/1980 | Planebo | |
| 4,254,569 A | 3/1981 | Janik | |
| 4,270,290 A | 6/1981 | Eckert | |
| 4,310,978 A | 1/1982 | Stern | |
| 4,360,240 A | 11/1982 | Koncelik et al. | |
| 4,360,991 A | 11/1982 | West | |
| 4,364,984 A | 12/1982 | Wentworth | |
| 4,428,136 A | 1/1984 | Franklin | |
| 4,447,973 A | 5/1984 | Wihlke | |
| 4,457,436 A | 7/1984 | Kelley | |
| 4,470,571 A | 9/1984 | Hartman | |
| 4,478,467 A | 10/1984 | Tyndall | |
| 4,569,448 A | 2/1986 | Graham | |
| 4,588,190 A | 5/1986 | Stewart et al. | |
| 4,606,394 A | 8/1986 | Bannister | |
| 4,620,635 A | 11/1986 | Morand | |
| 4,652,239 A | 3/1987 | Brimberg | |
| 4,658,966 A | 4/1987 | Broek | |
| 4,715,154 A | 12/1987 | Baloga | |
| 4,723,665 A | 2/1988 | Benedict et al. | |
| 4,723,821 A | 2/1988 | Montgomery | |
| 4,750,305 A | 6/1988 | Bastian | |
| 4,757,901 A | 7/1988 | Woods | |
| 4,771,557 A | 9/1988 | Bowman | |
| 4,793,495 A | 12/1988 | Preu | |
| 4,805,331 A | 2/1989 | Boggess et al. | |
| 4,902,229 A | 2/1990 | Pedersen et al. | |
| 4,913,297 A | 4/1990 | Wells | |
| 4,928,465 A | 5/1990 | Del Castillo Von Haucke | |
| 4,930,237 A | 6/1990 | Oliphant | |
| 4,932,172 A | 6/1990 | Maas | |
| 4,954,382 A | 9/1990 | Riefler et al. | |
| 4,960,383 A | 10/1990 | Smith et al. | |
| 4,979,785 A | 12/1990 | Richards | |
| 4,996,110 A | 2/1991 | Tanuma et al. | |
| 5,016,373 A | 5/1991 | Theno | |
| 5,090,171 A | 2/1992 | Kano et al. | |
| 5,105,952 A | 4/1992 | Krattiger | |
| 5,109,994 A | 5/1992 | Kidd et al. | |
| 5,112,020 A | 5/1992 | Ginsberg | |
| 5,125,202 A | 6/1992 | Kissinger | |
| 5,139,155 A | 8/1992 | Laxson | |
| 5,148,925 A | 9/1992 | Althoff et al. | |
| 5,160,050 A | 11/1992 | Russo | |
| 5,160,189 A | 11/1992 | Johnston et al. | |
| 5,161,321 A | 11/1992 | Kuhnke | |
| 5,181,334 A | 1/1993 | Mima | |
| 5,186,499 A | 2/1993 | Mason | |
| 5,214,885 A | 6/1993 | Maas et al. | |
| 5,226,548 A | 7/1993 | Koeppel | |
| 5,241,796 A | 9/1993 | Hellwig et al. | |
| 5,248,536 A | 9/1993 | Du Katz | |
| 5,253,368 A | 10/1993 | Blake | |
| 5,282,341 A | 2/1994 | Baloga et al. | |
| 5,289,926 A | 3/1994 | Lewis et al. | |
| 5,290,002 A | 3/1994 | Cohen | |
| 5,301,477 A | 4/1994 | Rellinger et al. | |
| 5,309,686 A | 5/1994 | Underwood et al. | |

| | | |
|---|---|---|
| 5,321,579 A | 6/1994 | Brown et al. |
| 5,342,665 A | 8/1994 | Krawitz |
| 5,368,486 A | 11/1994 | Kurzman |
| 5,375,802 A | 12/1994 | Branham, II |
| 5,384,999 A | 1/1995 | Roche et al. |
| 5,392,934 A | 2/1995 | Fox |
| 5,394,631 A | 3/1995 | Bosio |
| 5,406,761 A | 4/1995 | Hobbiebrunken et al. |
| 5,422,155 A | 6/1995 | Spence, Jr. |
| 5,428,928 A | 7/1995 | Hellwig et al. |
| 5,486,391 A | 1/1996 | Tyner |
| 5,495,953 A | 3/1996 | Bearth |
| 5,503,278 A | 4/1996 | Ishmael |
| 5,511,348 A | 4/1996 | Cornell et al. |
| 5,513,574 A | 5/1996 | Collins |
| 5,536,080 A | 7/1996 | Madimenos et al. |
| 5,549,267 A | 8/1996 | Armbruster et al. |
| 5,558,418 A | 9/1996 | Lambright et al. |
| 5,569,503 A | 10/1996 | Piotroski |
| 5,584,546 A | 12/1996 | Gurin et al. |
| 5,588,659 A | 12/1996 | Boes et al. |
| 5,590,940 A | 1/1997 | Richard |
| 5,607,214 A | 3/1997 | Pierce et al. |
| 5,609,112 A | 3/1997 | Meyer et al. |
| 5,617,660 A | 4/1997 | Pollack |
| 5,635,265 A | 6/1997 | Potokar |
| 5,647,172 A | 7/1997 | Rokicki |
| 5,649,631 A | 7/1997 | Loflin |
| 5,655,323 A | 8/1997 | Lassoff |
| 5,655,672 A | 8/1997 | Stuchlik, III |
| 5,658,635 A | 8/1997 | Davis et al. |
| 5,675,946 A | 10/1997 | Verbeek et al. |
| 5,676,631 A | 10/1997 | Kunz et al. |
| 5,682,695 A | 11/1997 | Hoffman |
| 5,687,499 A | 11/1997 | Brnjac |
| 5,687,513 A | 11/1997 | Baloga et al. |
| 5,688,579 A | 11/1997 | Konsti et al. |
| 5,694,881 A | 12/1997 | Creech |
| 5,695,264 A | 12/1997 | Koch |
| 5,697,589 A | 12/1997 | Garfinkle |
| 5,711,121 A | 1/1998 | Garver |
| 5,724,778 A | 3/1998 | Cornell et al. |
| 5,743,193 A | 4/1998 | Kakuta et al. |
| 5,746,330 A | 5/1998 | DiBetta |
| 5,765,315 A | 6/1998 | Nagamitsu et al. |
| 5,771,954 A | 6/1998 | Benner et al. |
| 5,794,392 A | 8/1998 | Forslund et al. |
| 5,826,385 A | 10/1998 | Dykstra et al. |
| 5,826,639 A | 10/1998 | Miller |
| 5,829,202 A | 11/1998 | Canton Gongora et al. |
| 5,831,211 A | 11/1998 | Gartung et al. |
| 5,848,698 A | 12/1998 | Stompe |
| 5,873,205 A | 2/1999 | Hanlon et al. |
| 5,901,485 A | 5/1999 | Kiggins |
| 5,901,513 A | 5/1999 | Mollenkopf et al. |
| 5,913,787 A | 6/1999 | Edwards |
| 5,931,429 A | 8/1999 | Hellwig et al. |
| 5,941,713 A | 8/1999 | Wayner et al. |
| 5,966,879 A | 10/1999 | Verbeek et al. |
| 5,984,441 A | 11/1999 | Stokhuijzen |
| 5,987,794 A | 11/1999 | Lavi et al. |
| 6,015,124 A | 1/2000 | Loy |
| 6,048,044 A | 4/2000 | Biggel et al. |
| 6,076,317 A | 6/2000 | Hellwig et al. |
| 6,249,999 B1 | 6/2001 | Borge et al. |
| 6,675,946 B2 | 1/2004 | Lutz |

OTHER PUBLICATIONS

Brochure for "TooGo New Workplace Solutions", by Egan Visual, bearing a designation "(C)Copyright Egan Visual 1999", 16 color sheets.
Details—Mar. 2001, 5 pages.
Brochure by UNIFOR titled "Pannelli PL" (undated) (37 sheets).
Brochure by UNIFOR titled "Progetto 25.90" (undated) (19 sheets).
Promotional material (chart) by Dowing Displays of Milford, Ohio, showing display models (no date), color.
Promotional material for "The Office Of The Future", by Tarrant Interiors—of Fort Worth, Texas, (no date), 4 sheets.
Innamorati, Francesco, "The Telematic Tree", Habitat Ufficio, bearing a designation 1991.
Advertisement for "Ameriwood Oak Armoire", by Office Max, bearing a designation "Nov. 11, 1995", 1 sheet.
Gertsakis, John, *"Durable Yet Future Proof"*, bearing a designation "©1996, National Key Centre for Design at RMIT", 4 sheets, printed from Internet site: www.cfd.rmit.edu.au/outcomes/erdnews/ERD6/HOTdesk.html on Oct. 27, 1998.
Peter Piper Products Inc. sales materials, Undated.
Steelcase Inc. sales materials, Undated.
Sunrise Business Products sales materials, Undated.
K.O.H. sales materials, Undated.
Best–Rite Manufacturing sales materials, Undated.
Peter Piper Products Inc. sales materials, Undated.
K.O.H. sales materials, Undated.
Quartet™ sales materials, shown in Corporate Express office supplies catalogue, bearing a designation "Printed in the U.S.A. ® 1997".
Quartet™ sales materials, shown in Redwood office supplies catalogue, Undated.
Bretford™ sales materials, Undated.
Egan sales materials, bearing a desgnation "Printed in Canada ® Copyright Egan Visual 1994".
Egan sales materials, Undated.
3M sales materials, Undated.
Teknion sales materials, Undated.
Stanrite sales materials, Undated.
Quartet ™ sales materials, in BT Office Products International catalogue, Undated.
Wilkahn sales materials, Undated.

* cited by examiner

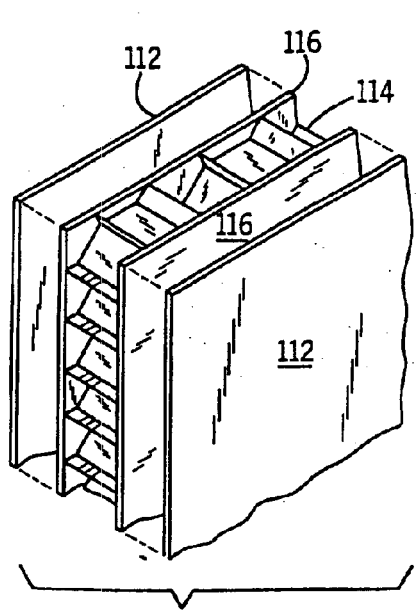
FIG. 3
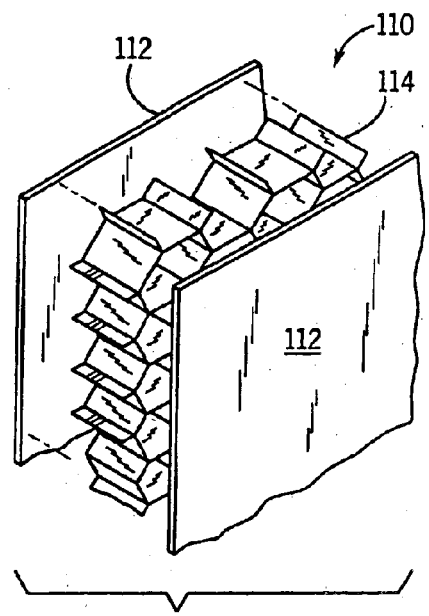
FIG. 4
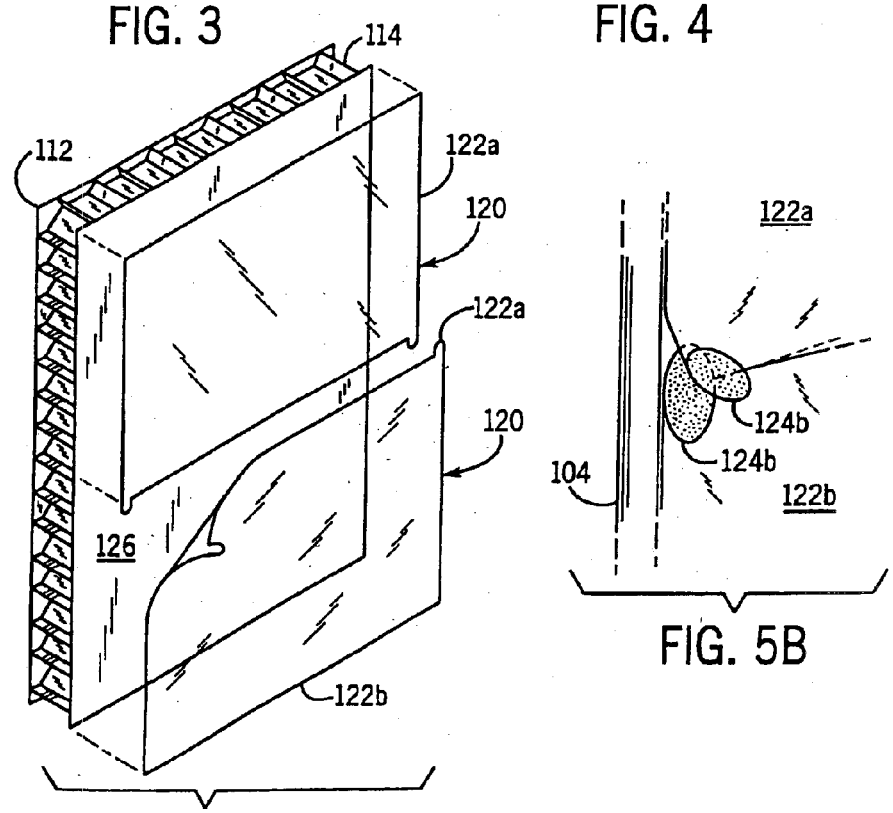
FIG. 6
FIG. 5B

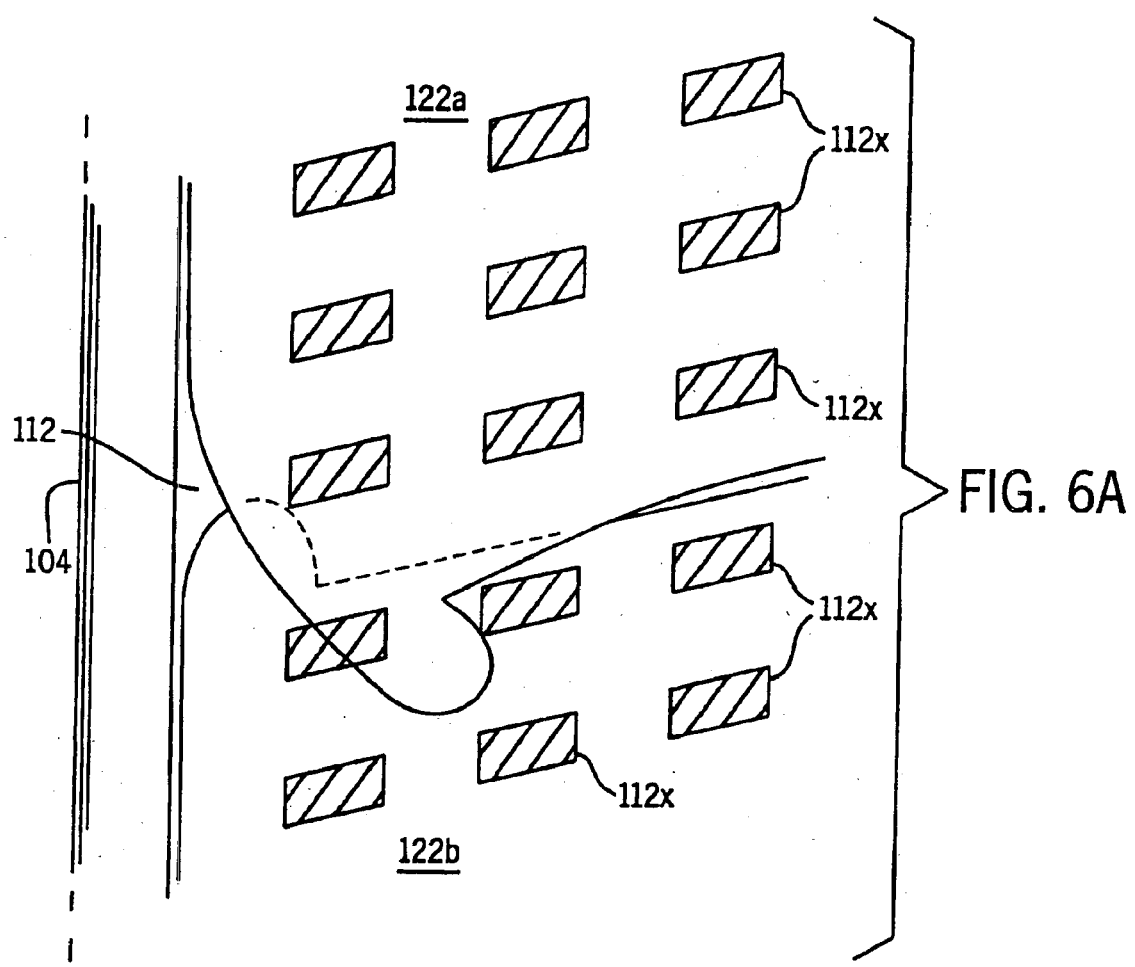

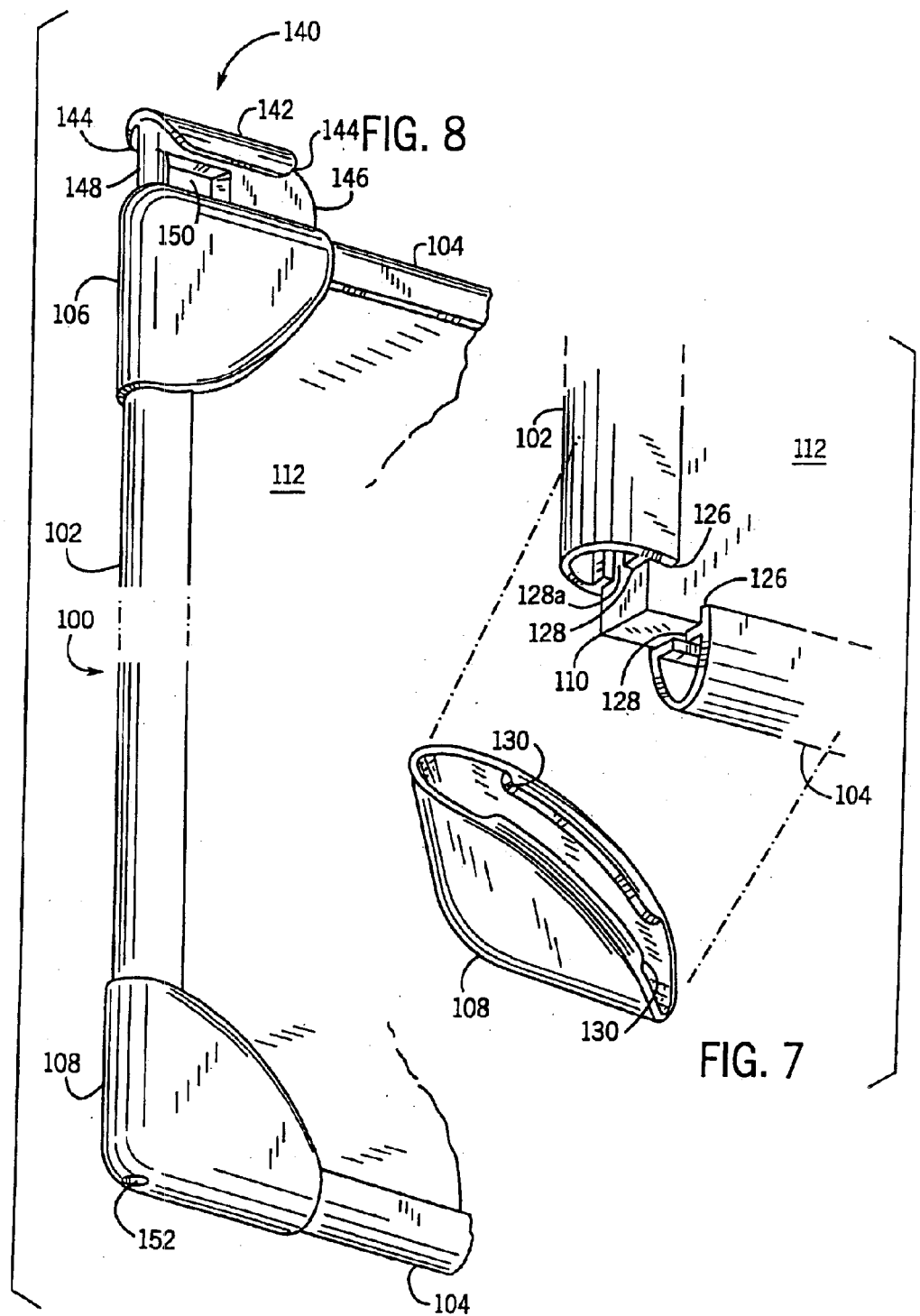

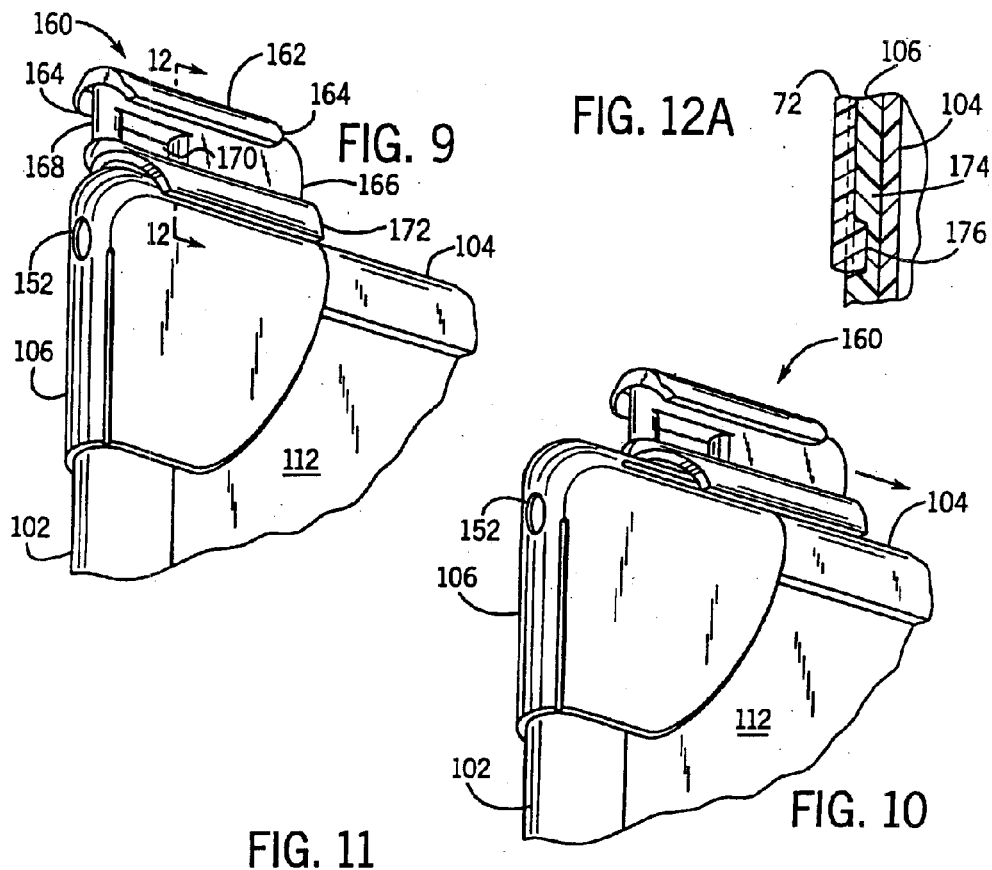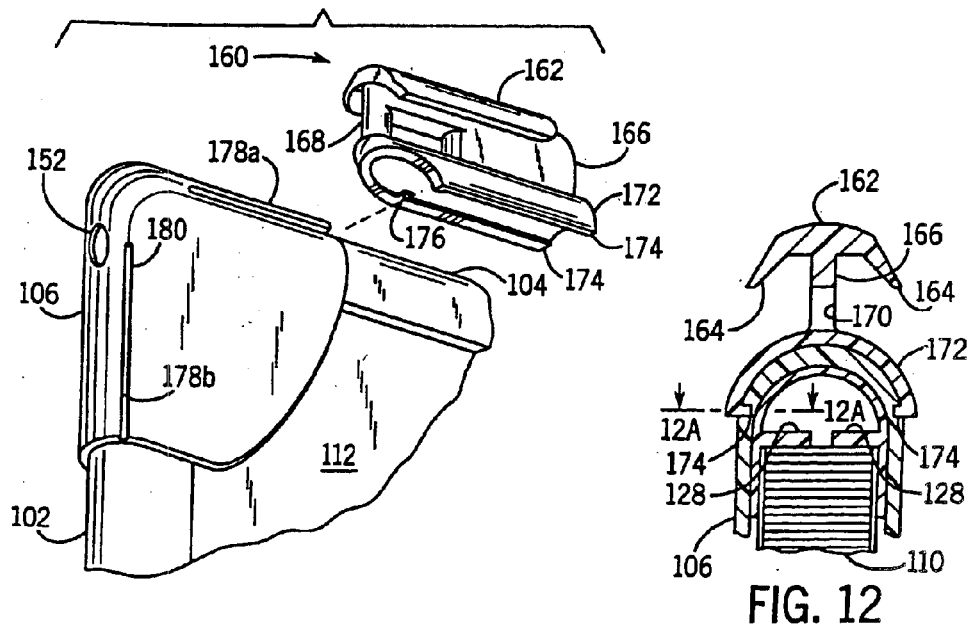

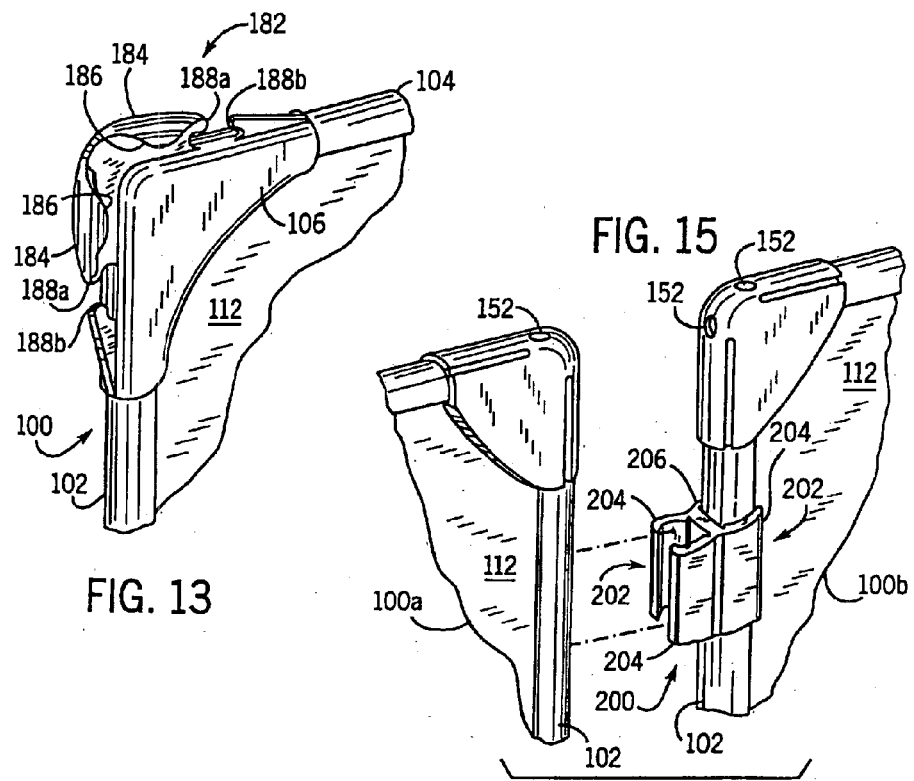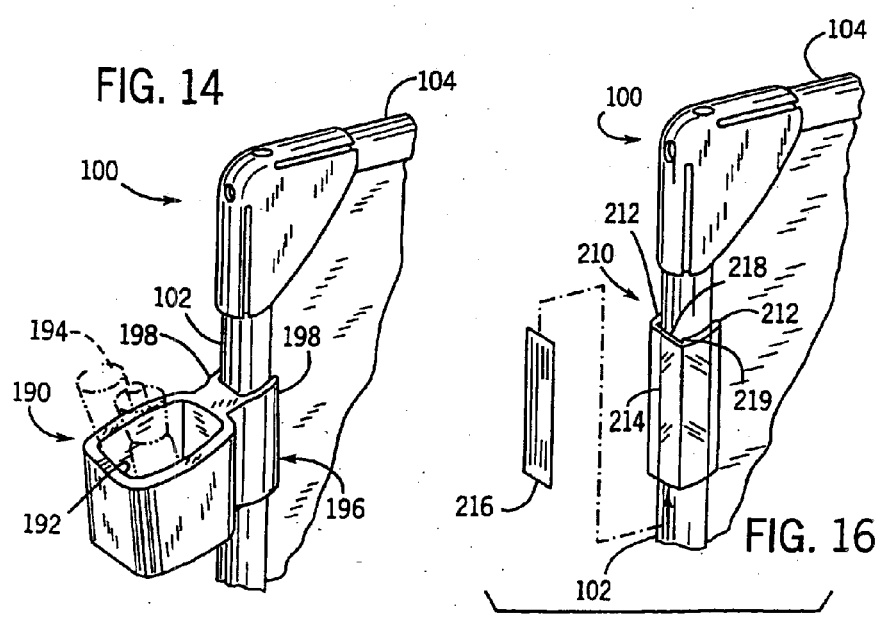

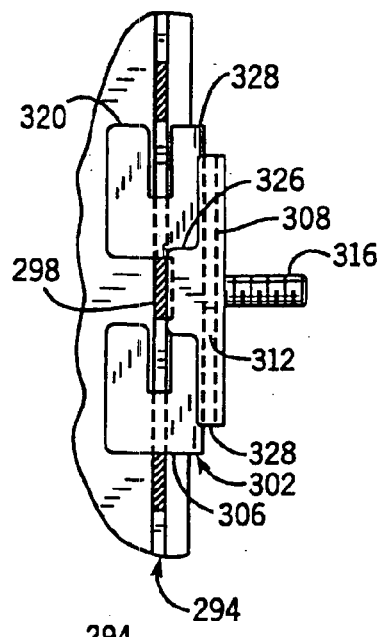
FIG. 21A
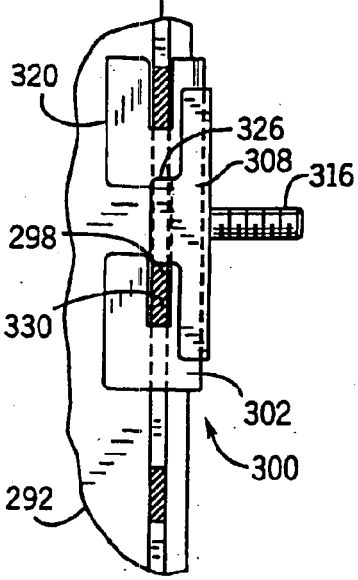
FIG. 21B
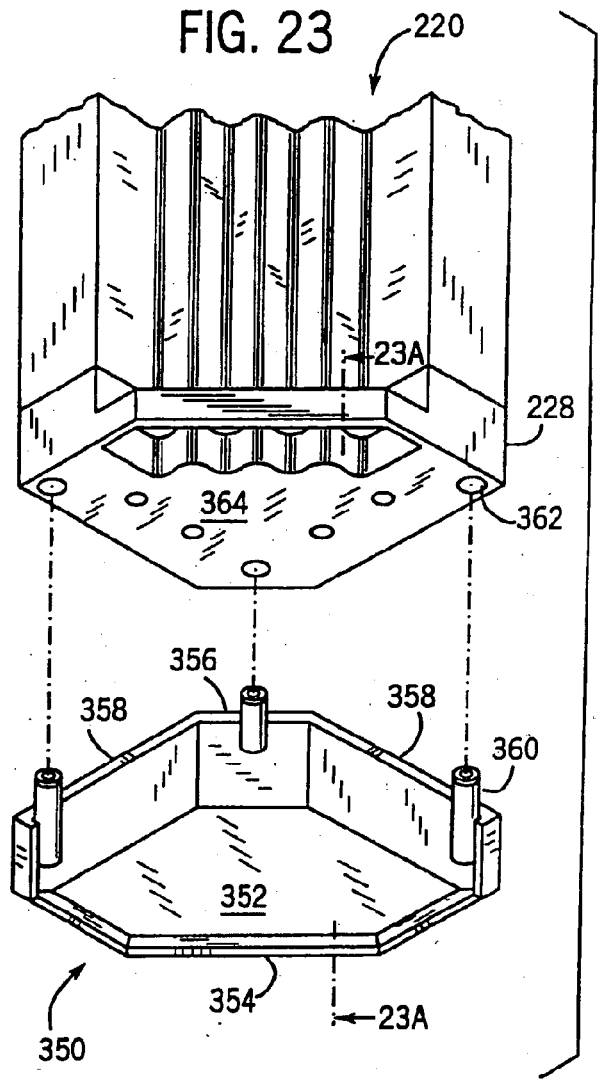
FIG. 23
FIG. 23A
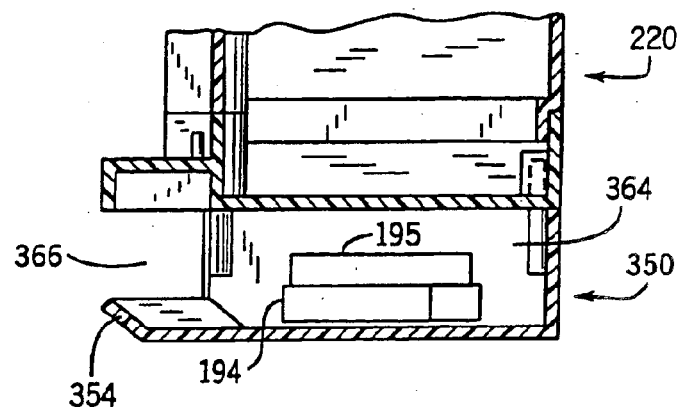

FIG. 24
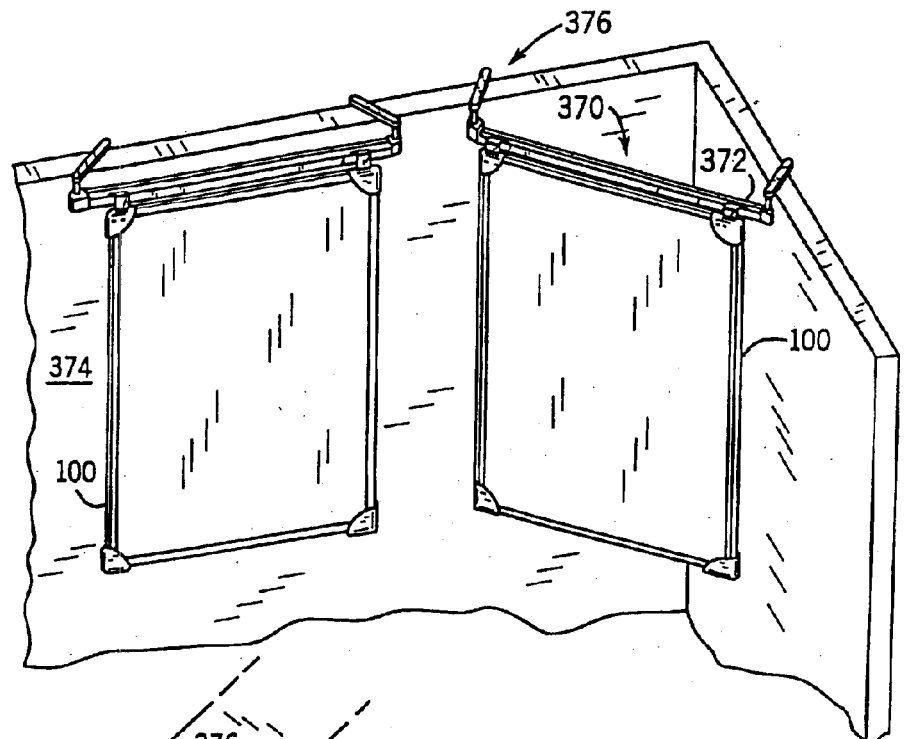
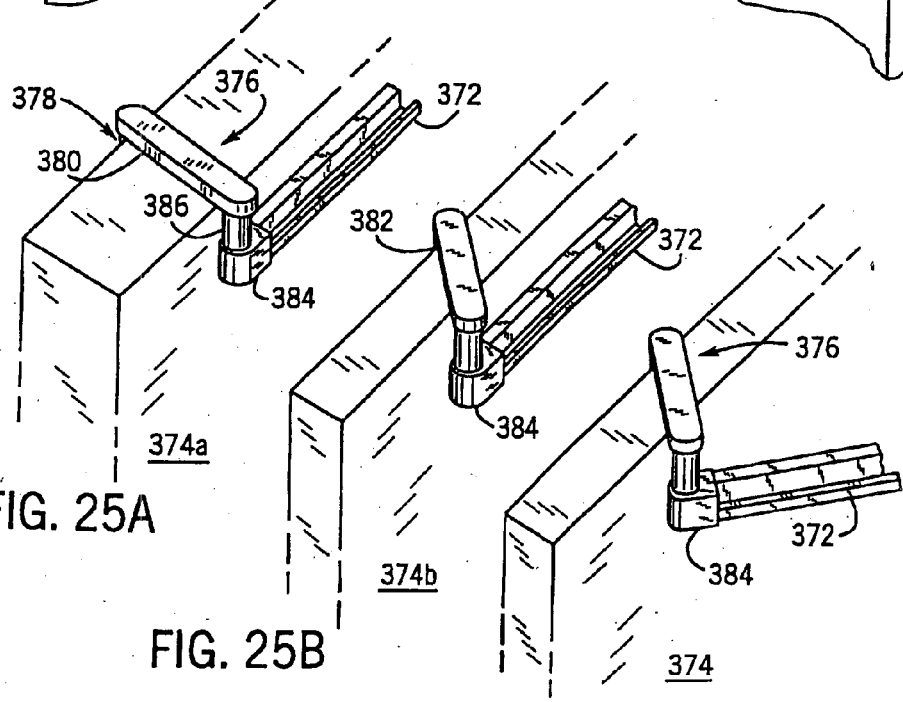
FIG. 25A
FIG. 25B
FIG. 25C

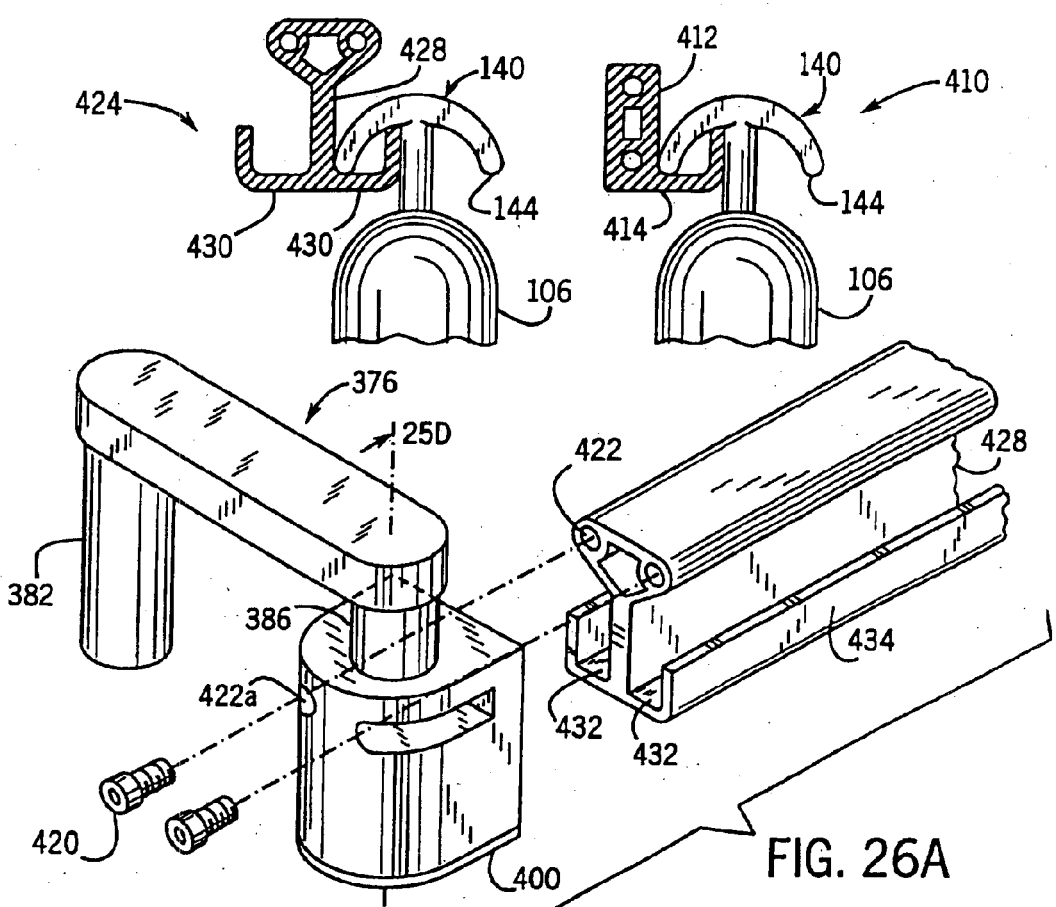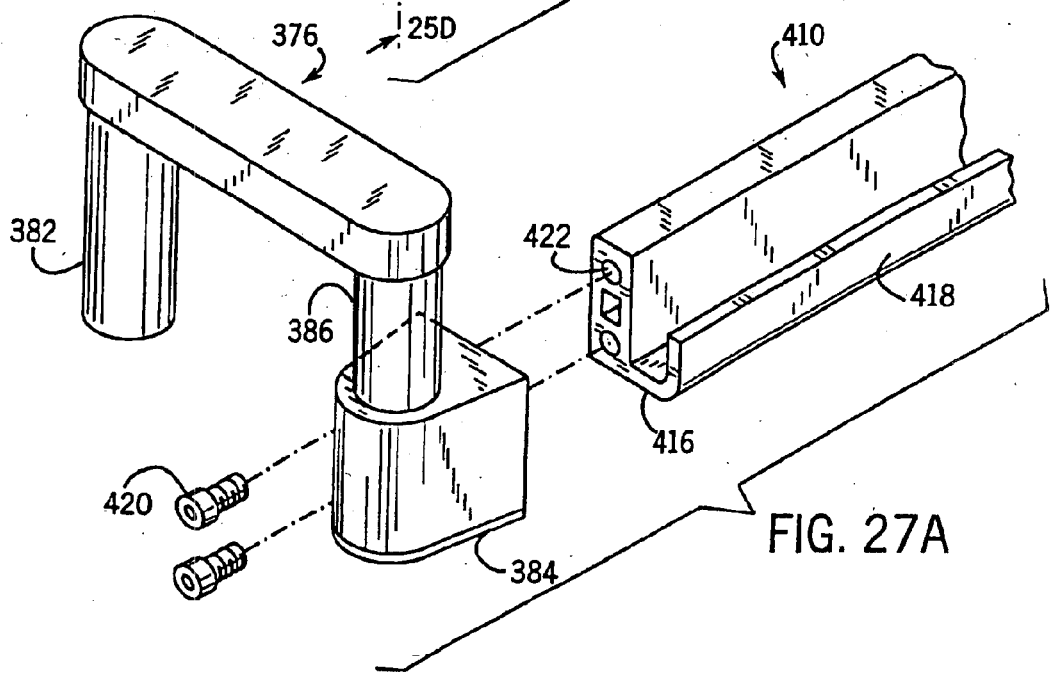

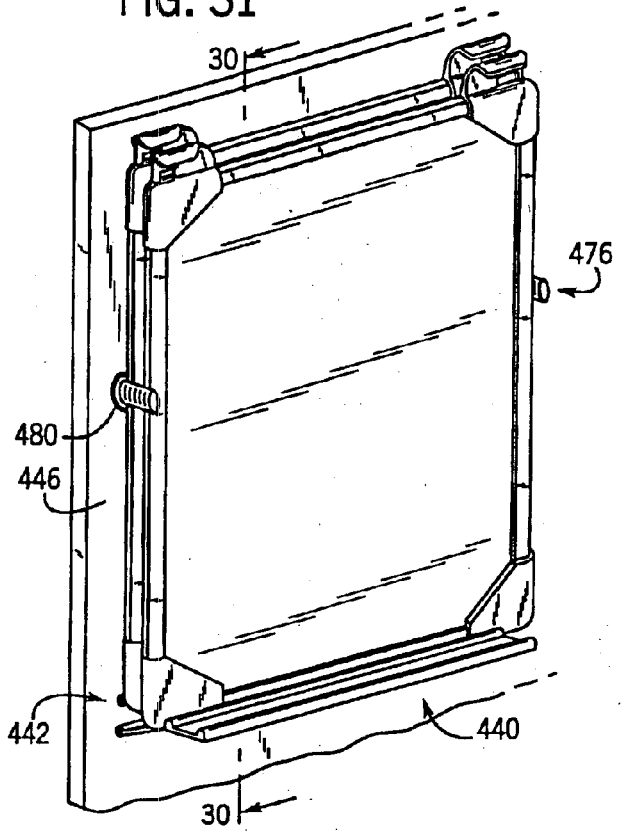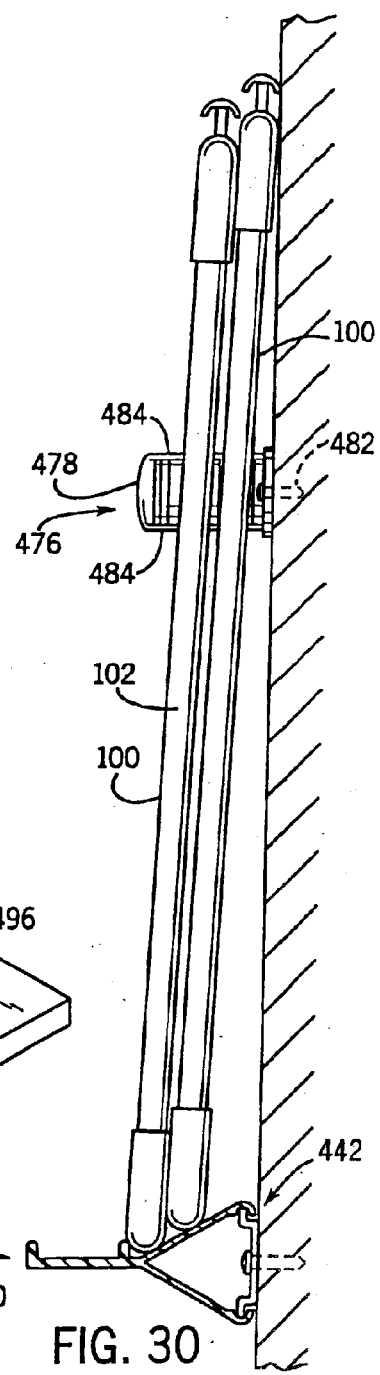

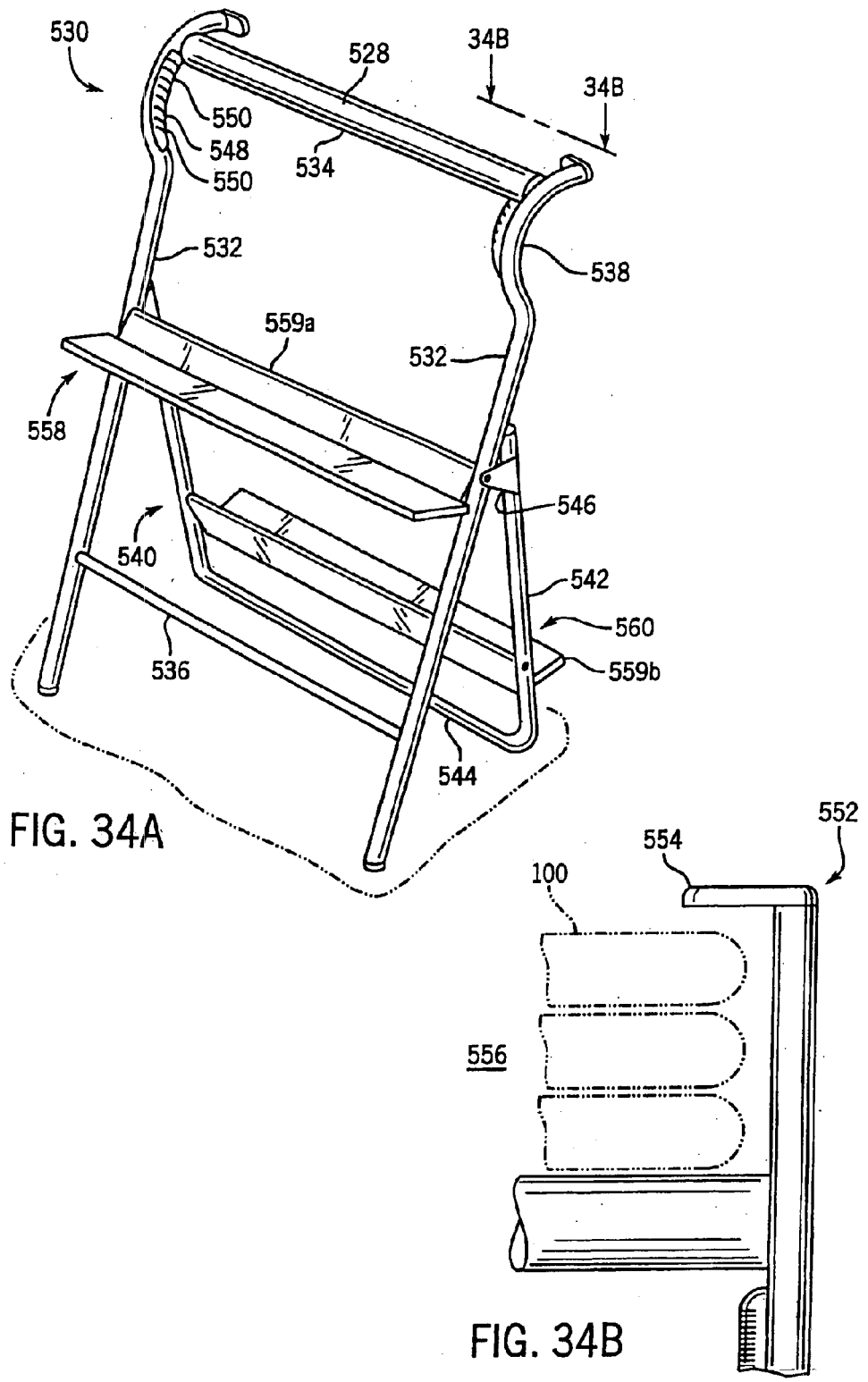

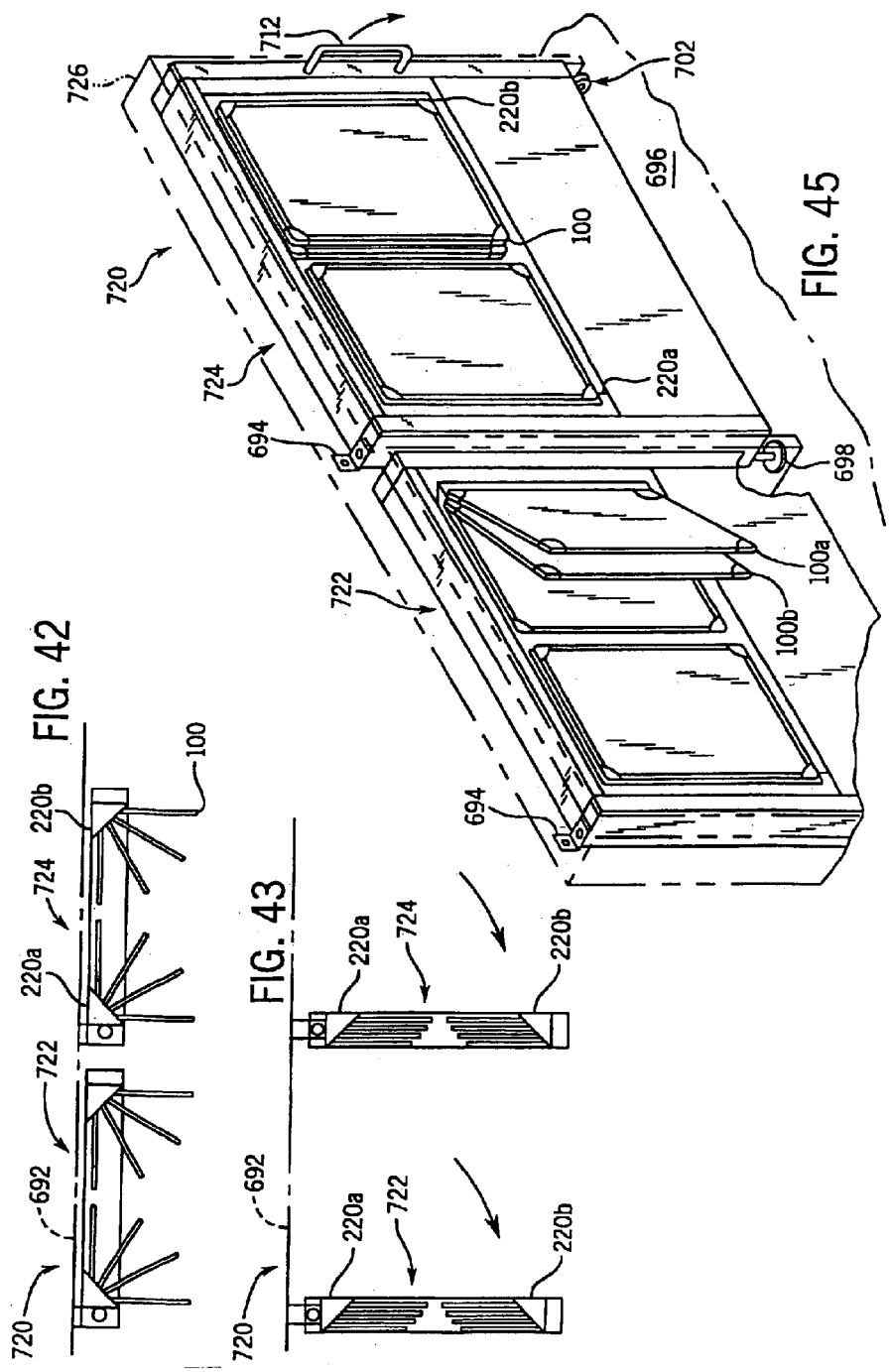

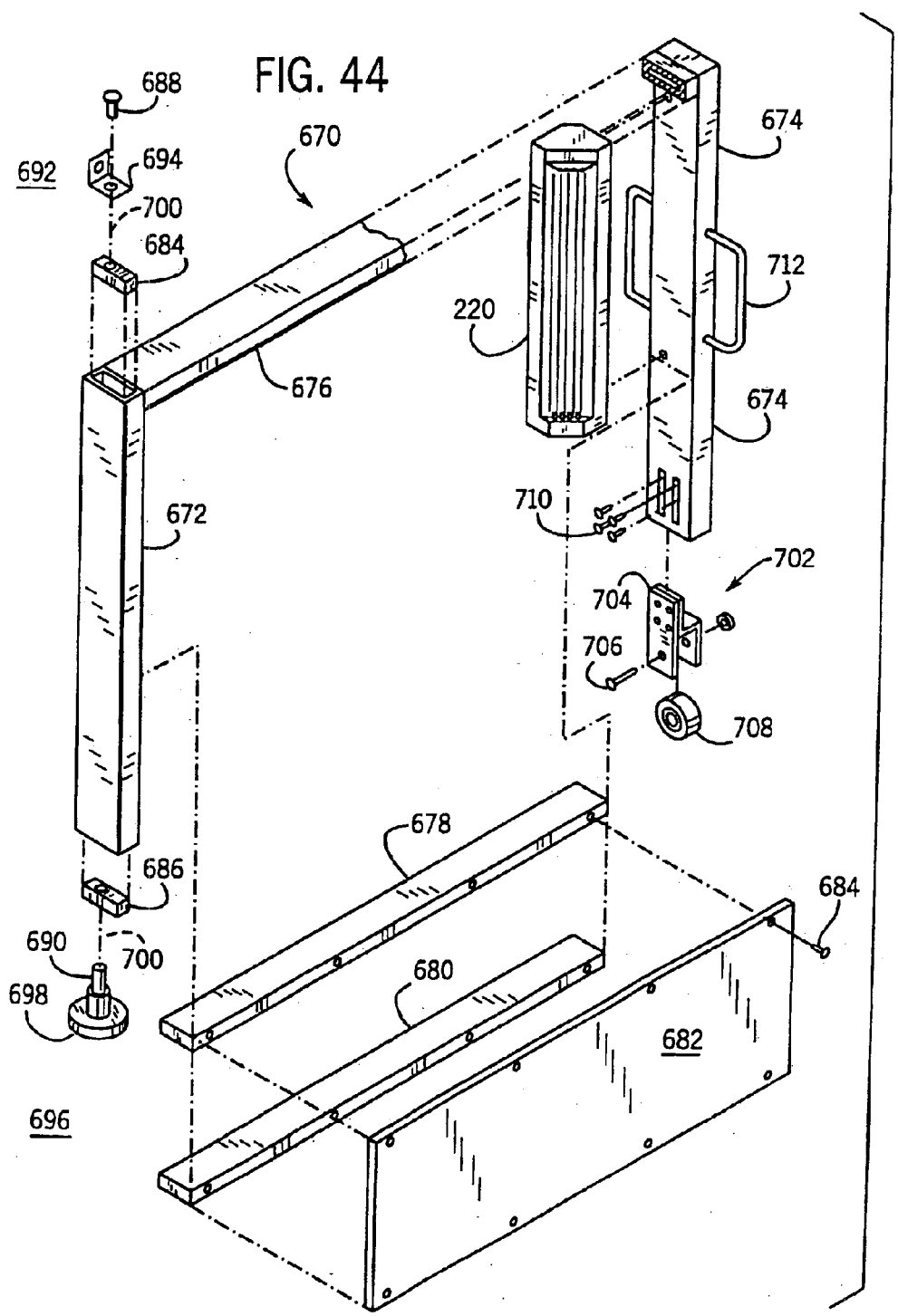

DISPLAY BOARD SYSTEM

This application is a continuation in part of 09/182,999 filed Oct. 30, 1998 now U.S. Pat. No. 6,272,779.

CROSS-REFERENCE TO RELATED APPLICATIONS

The following U.S. patent applications are cross-referenced and incorporated by reference herein: (a) U.S. application Ser. No. 09/182,998 titled "INFORMATION DISPLAY SYSTEM"; (b) U.S. Pat. No. 6,374,547 titled "WORK STATION" which issued on Apr. 23, 2002; (c) U.S. Pat. No. 6,463,701 titled "WORK ENVIRONMENT" which issued Oct. 15, 2002; (d) U.S. Pat. No. 6,263,602, titled "DISPLAY BOARD SYSTEM" which issued Jul. 24, 2001; and (e) U.S. Pat. No. 6,272,779, titled "DISPLAY BOARD SYSTEM" which issued Aug. 14, 2001.

FIELD OF THE INVENTION

The present invention relates to a display board system. The present invention more particularly relates to a display board system including display boards having a variety of surface treatments and providing a variety of mounting interfaces and associated mounting structures to facilitate the use and storage of the display boards.

BACKGROUND OF THE INVENTION

It is well known to display information on surfaces, typically boards on which the information is contained. For example, information is displayed on billboards, signs, prints, posters, chalk boards, white boards, installed through mounting interfaces to mounting structures such as walls, racks, posts, stands, to name but a few known applications. In a general sense, such known applications very ably provide for the display of information. However, such known applications are typically characterized either by their relative permanence or by their relative impermanence because of the surfaces on which the information is contained. For example, the mounting interfaces and associated mounting structures holding or providing for the surfaces, are generally either too rigid and inflexible, i.e. immobile and difficult to reconfigure or otherwise to use and store information, as in the case of information that is applied on a fixed wall, or too insubstantial, i.e. highly mobile but otherwise tending to put the information on display at risk of loss before it can be stored, as in the case of information that is posted on a vertical surface (e.g. a bulletin board). As a result, such known applications are generally not well suited for use in a dynamic work environment, where information is ideally created, displayed (e.g., shared and communicated) and stored in a highly efficient manner.

In an attempt to overcome the shortcomings of such known applications, the use of "display boards," discrete information-containing structures that are mounted within a work space or work environment, has proliferated. However, such known display boards have typically not been provided with mounting interfaces that facilitate the use and storage of the display boards in a manner that facilitates "information persistence"—with information on the display boards being made readily available when needed while conveniently stowed when not needed, for example, for a group project. Moreover, the surface treatments applied to such known display boards are generally limited; such known display boards have typically not been provided with a combination of useful surface treatments that allow information to be conveyed in a variety of media. Nor have such known display boards been provided with mounting interfaces and associated mounting structures in a system that facilitates the use and interchangeability of the display boards and the use, display and storage of information contained on the display boards.

Accordingly, it would be advantageous to have a display board system adapted to use, display and store information efficiently in a dynamic work environment. It would also be advantageous to have a display board system that includes display boards having surface treatments that facilitate the collection, transformation, use, display and storage of information in a wide variety of formats. It would further be advantageous to have a display board system providing display boards of a similar basic construction and format and a relatively low cost, yet readily adapted for use with a plurality of mounting interfaces. It would further be advantageous to have a plurality of mounting structures adapted to support and promote the use, display and storage of the display boards. It would further be advantageous if the mounting structures were configured to allow the efficient use, display and storage of display boards so that information contained on the display boards could efficiently be used, displayed and stored by persons in a work environment to increase productivity, particularly in the performance of groups.

SUMMARY OF THE INVENTION

The present invention relates to an apparatus for display of information in a work environment. The apparatus includes a display board with a substantially rigid core and defines a first side having a first surface and a second side opposite of the first side having a second surface. The first surface has a first surface treatment and the second surface has a second surface treatment. The first surface treatment includes a reusable adhesive and a clear film cover over the reusable adhesive.

The present invention further relates to an apparatus for display of information in a work environment. The apparatus includes a display board with a substantially rigid core and defining a first side having a first surface and a second side opposite of the first side having a second surface, the first surface having a first surface treatment and the second surface having a second surface treatment. The first surface treatment includes a reusable adhesive and the second surface treatment is a functional surface treatment.

The present invention further relates to an apparatus for display of information in a work environment. The apparatus includes a display board with a substantially rigid core and defining a first side having a first surface and a second side opposite of the first side having a second surface, the first surface having a first surface treatment and the second surface having a second surface treatment. The display board has a generally rectangular shape with a first set of corners each having a first multi-functional mounting interface and a second set of corners each having a second mounting interface.

The present invention further relates to a mounting structure for at least one display board providing a first mounting interface and a second mounting interface. The mounting structure includes a first pivotal interface adapted to engage the first mounting interface of the display board and a second pivotal interface adapted to engage the second mounting interface of the display board so that the display board is removably pivotally mounted within the mounting structure.

The present invention further relates to a mounting structure for associating at least one display board providing a mounting interface with a panel wall having a top and a first side opposing a second side. The mounting structure includes a rail having a first end and a second end and at least one track for engagement with the mounting interface of the display board between the first end and the second end and an end fitting coupled to each of the first end of the rail and the second end of the rail. The mounting structure also includes a hook for placement over the top of the panel wall, a pivot post coupled to the hook and pivotally coupled to the end fitting, and a spring member coupled to the pivot post within the end fitting tending to draw the hook into contact with the first side of the panel wall and the end fitting into contact with the second side of the panel wall.

The present invention further relates to a mounting structure for display of at least one display board. The mounting structure includes a frame, a platform for the display board coupled to the frame, and a compliant retaining system for the display board coupled to the frame. The display board can be placed on the platform and pressed into secure engagement with the compliant retaining system.

The present invention further relates to an easel for use with at least one display board. The easel includes a base, a first frame section coupled to the base, a second frame section coupled to the base, a stowing area formed between the first frame section and second frame section, a first tray coupled to the first frame section, and a second tray coupled to the second frame section. A first display board can be placed on display on the first tray, a second display board can be placed on display on the second tray, and a plurality of display boards can be stored in the stowing area.

The present invention further relates to a mounting structure associated with an existing structure and for use with at least one display board. The mounting structure includes an articulating frame pivotally coupled to the existing structure for movement between a fully deployed position and a fully stowed position. The mounting structure also includes at least one display rack coupled to the articulating frame and providing an interface for pivotal coupling of a plurality of display boards.

The present invention further relates to an easel having a base and a support frame adapted to provide for the display of display boards on a tray coupled to the support frame. The base of the easel has a nested portion and a nesting portion so that one easel can be nested within another easel.

The present invention further relates to an easel having a base and a support frame adapted to provide for the display of display boards on a tray coupled to the support frame. The easel includes pivotally coupling the base to the support frame and pivotally coupling the tray to the support frame.

DESCRIPTION OF THE FIGURES

FIG. 3 is a fragmentary exploded perspective view of the display board.

FIG. 4 is a fragmentary exploded perspective view of a display board according to an alternative embodiment.

FIG. 5 is a perspective view of a display board according to an alternative embodiment with a clear film overlay.

FIG. 5A is a fragmentary perspective view of the display board of FIG. 5 showing a detail of lifting tabs.

FIGS. 5B through 5D are fragmentary perspective views of the display board of FIG. 5 showing a detail of lifting tabs according to an alternative embodiment.

FIG. 6 is a perspective view of the construction of the display board of FIG. 5.

FIG. 6A is a fragmentary perspective view of a display board according to an alternative embodiment.

FIG. 7 is a fragmentary partially exploded perspective view of the display board of FIG. 1 showing a mounting arrangement.

FIG. 8 is a fragmentary perspective view of the display board of FIG. 1 showing a mounting arrangement.

FIGS. 9 and 10 are fragmentary perspective views of a display board according to an alternative embodiment showing a mounting arrangement.

FIG. 11 is a fragmentary partially exploded perspective view of a display board according to an alternative embodiment showing a mounting arrangement.

FIG. 12 is a sectional elevation view of the display board of FIGS. 9 through 11 taken at line 12—12 in FIG. 9.

FIG. 12A is a fragmentary sectional plan view of the display board taken at line 12A—12A in FIG. 12.

FIG. 13 is a fragmentary perspective view of a display board according to an alternative embodiment providing a universal corner member.

FIG. 14 is a fragmentary perspective view of a display board system including a storage cup clip arrangement.

FIG. 15 is a fragmentary partially exploded perspective view of a display board system including a coupling arrangement.

FIG. 16 is a fragmentary partially exploded perspective view of a display board system including a label arrangement.

FIGS. 21A and 21B are fragmentary sectional plan views of the mounting arrangement of FIG. 21 taken along line 21A—21A in FIG. 21.

FIG. 23 is a fragmentary exploded perspective view of the mounting structure of FIG. 17 including a carrier.

FIG. 23A is a fragmentary sectional elevation view of the mounting structure of FIG. 23 taken along line 23A—23A in FIG. 23.

FIG. 24 is a perspective view of a mounting structure for a display board system according to an exemplary embodiment of the present invention.

FIGS. 25A through 25C are fragmentary perspective views of the mounting structure of FIG. 24.

FIG. 26 is a fragmentary sectional elevation view of a mounting structure for a display board system according to an exemplary embodiment of the present invention.

FIG. 26A is a fragmentary exploded perspective view of the mounting structure of FIG. 26.

FIG. 27 is a fragmentary sectional elevation view of a mounting structure for a display board system according to an exemplary embodiment of the present invention.

FIG. 27A is a fragmentary exploded perspective view of the mounting structure of FIG. 27.

FIG. 30 is a side elevation view of a mounting structure for a display board system according to an exemplary embodiment of the present invention.

FIG. 31 is a perspective view of the mounting structure of FIG. 30.

FIG. 32 is a perspective view of a mounting structure of a display board system according to an exemplary embodiment of the present invention.

FIG. 34A is a perspective view of a mounting structure for a display board system according to an exemplary embodiment of the present invention.

FIG. 34B is a fragmentary sectional perspective view of the mounting structure of FIG. 34A taken along line 34B—34B in FIG. 34A.

FIGS. 42 and 43 are top plan views of a mounting structure for a display board system according to an exemplary embodiment of the present invention.

FIG. 44 is a fragmentary exploded perspective view of the mounting structure of FIGS. 42 and 43.

FIG. 45 is a perspective view of the mounting structure of FIGS. 42 and 43.

DETAILED DESCRIPTION OF THE PREFERRED EMBODIMENTS

Figure 1:
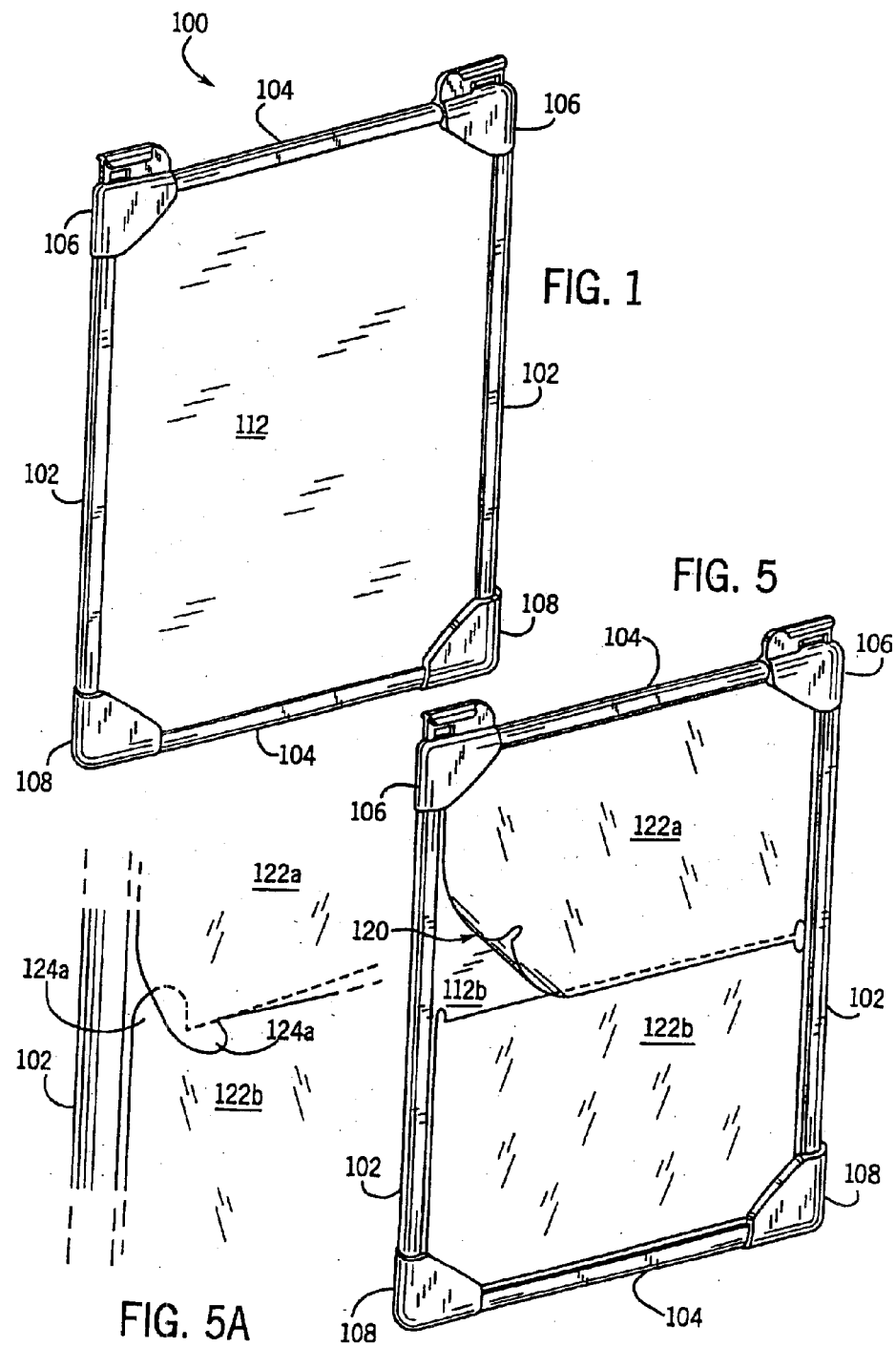
FIG. 1 is a perspective view of a display board according to a preferred embodiment of the present invention.
Figure 2:
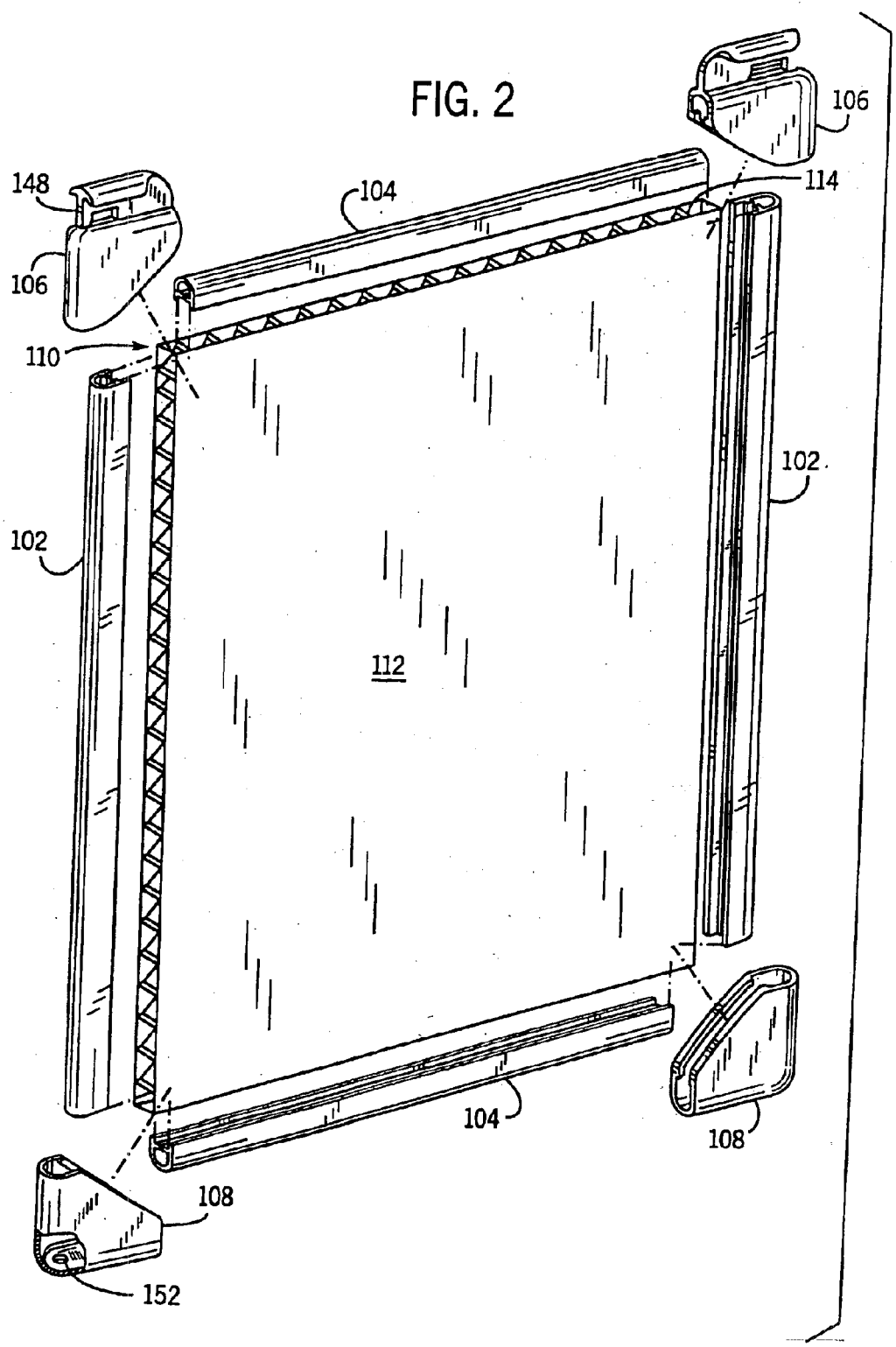
FIG. 2 is an exploded perspective view of the display board.

Referring to FIGS. 1 and 2, a display board 100 is shown according to an exemplary embodiment of the present invention. Display board 100 includes side frame members shown as extruded edge trim members 102 and top and bottom frame members also shown as extruded edge trim members 104. Display board 100 includes four corner members 106 (top) and 108 (bottom) secured to side frame members 102 and top and bottom frame members 104. Display board 100 includes a rigid core 110 providing outer surfaces, namely a front surface 112 and a back surface (not visible).

According to any preferred embodiment, the display board is configured in a generally symmetrical basic form so that the designation of a "front surface" and "back surface" is essentially arbitrary and dependent upon the orientation of the display board with respect to a person intending to use the display board. As shown in the Figs., and as will be apparent to those who review this disclosure, the outer surfaces of the display boards may be provided with a wide variety of functional surface treatments (e.g. tackable adhesive, clear film overlay or "photo album", dear film "pocket", writable clear film, cork or tack board, peg board, magnetic board, marker board, dry erase or "white" board, paper or paper tablet, projection screen, etc.) or decorative surface treatments (e.g. graphics display, cloth, etc.) in a wide variety of combinations (i.e. with one surface differing in whole or in part from the other surface) that may be suited or adapted to a wide variety of functional and decorative purposes according to preferred and other alternative or exemplary embodiments of the present invention. According to any preferred embodiment, the display boards are configured for ease and flexibility of use (e.g. recording, mapping, transformation, capture, etc.), display (e.g. sharing and communicating), and storage (e.g. persistence) of information, as well as of mounting and removal from associated mounting structures.

As evident from FIGS. 3, 4 and 7, the rigid core of the display board may be formed of any of a variety or materials or have any of a variety of constructions. According to a preferred embodiment, as shown in FIGS. 1 through 3, rigid core 110 of display board 100 is formed of an internal honeycomb core structure 114 having an external facing sheet 116. According to a particularly preferred embodiment, the honeycomb core structure with integrated facing sheet is of a type commercially available from Tenneco Packaging, Inc. of Lake Forest, Ill. Surface 112 of display board 100 is attached to facing sheet 116 (for example, by a hot melt adhesive, or by other methods). According to an alternative embodiment, as shown in FIG. 4, rigid core 110 may be formed from an open honeycomb core structure 114 (i.e. similar to that shown in FIG. 3 but without a external facing sheet) to which surface 112 is attached. According to another alternative embodiment, as shown in FIG. 7, rigid core 110 may be formed from a solid or composite material or any other types of materials. According to any preferred embodiment, the rigid core (and associated frame members) will be of a construction that provides for a display board that is lightweight yet of sufficient structural integrity to suit its intended purposes (i.e. as may be defined by the particular surface treatment and associated mounting structures) and generally resistant to warping and bending. According to a particularly preferred embodiment, the edge trim members are made of a plastic material.

As is shown, side frame members 102 and top and bottom frame members 104 fit over and are secured to the edge of rigid core 110 (e.g. a press fit working with application of an adhesive). Corner members 106 and 108 each fit over and are joined to one of side frame members 102 and one of top or bottom frame members 104 to form a secure frame structure for display board 100. (According to a particularly preferred embodiment, the corner members and frame members are made of a plastic material and are joined by ultrasonic welding; according to alternative embodiments, the members can be joined or attached by adhesives or fastening arrangements.) As shown in FIG. 7, each of frame members 102 and 104 provides a curved exterior but includes a generally orthogonal interior receptacle 128a shaped to receive and retain rigid core 110. The receptacle is formed between perimeter edges 126 of each frame member 102 and 104 and a pair of inwardly disposed transverse opposed ribs 128 (generally perpendicular to perimeter edges 126 and extending along the length of each frame member). Each corner member 106 (not shown) or 108 has a generally triangular profile (although other profiles may be used according to alternative embodiments) with a curved exterior and includes an opening configured to receive a corresponding corner portion of rigid core 110 and curved exterior of each of two adjacent frame members 102 and 104. The opening includes a pair of inwardly disposed opposed fins 130 that extend along a central portion of opening between a pair of opposed receptacles (each shaped to receive the curved exterior of frame members 102 or 104). During assembly, the corner member is press fit onto the corresponding corner portion of the rigid core and over the two adjacent frame members. Corner member 108 spreads open at opposed fins 130 (slightly) while crossing frame members 102 and 104, then springs back to locate corner member 108 onto corner portion of rigid core 110. According to a particularly preferred embodiment, the corner members are able to withstand a "drop" without damage to the display board.

According to an exemplary embodiment of display board 100 shown in FIG. 8, top corner member 106 includes an mounting element shown as an integral post-hook clip 140; bottom corner member 108 includes an aperture 152. Post-hook clip 140 includes a curved top cap 142 coupled to the top of corner member 106 by a web 146. Curved top cap 142 provides two opposed hooks 144. Post-hook clip 140 also includes a post 148 formed in web 146 (adjacent to a clearance slot 150). Bottom corner member 108 includes aperture 152 configured to fit on a pivot pin (not shown). As a result, a "multi-functional" mounting interface is provided and display board 100 is suited for both for hanging (e.g. by the hook of the top corner member with the bottom corner member free of any engagement) and for pivotal mounting (e.g. through the post of the top corner member and the aperture of the bottom corner member); in addition, display board 100 is also suited for other forms of engagement or display.

Referring to FIGS. 9 through 12A, according to an alternative embodiment, top corner member 106 includes a mounting element shown as a repositionable post-hook dip 160. As shown, repositionable post-hook clip 160 is of the same basic arrangement of integral post-hook clip 140, with curved top cap 162 providing hooks 164 and web 168 supporting top cap 162 and including post 168 and clearance slot 170. Repositionable post-hook clip 160 also includes a curved base cap 172 shaped to fit over the top or side of corner member 106. Base cap 172 of post-hook clip 160 includes a pair of inwardly disposed opposed fins 174, each fin having a tab 176 at its leading edge so that when it is installed into corresponding horizontal groove 178a or vertical groove 178b, post-hook clip 160 is secured by a slot 180 at the terminal end of either of grooves 178a or 178b which engage tab 176 in a compliant (e.g. "snap") fit (see FIG. 12A). As a result, depending upon how the repositionable post-hook clip is installed (and the direction of mounting or engagement), the display board may be engaged either in a "landscape" mode or a "portrait" mode.

Referring to FIG. 13, corner member 106 of display board 100 includes a "universal" integral mounting element 182 configured with a pair of caps 184 providing a set of hooks 186 both on the top and the side of corner member 106. Caps 184 also include a pair of opposed projections 188a and 188b both on the top and the side of corner member 106. Hooks 186 and projections 188a and 188b are configured for engagement with a mounting structure (not shown in FIG. 13). According to any preferred embodiment, the universal integral mounting element allows both for hanging attachment (e.g. by the hooks, as shown in exemplary FIGS. 26 and 27) or pivotal engagement (e.g. by projections 188a and 188b, see, e.g., FIGS. 23B and 23C). The universal integral mounting element (e.g. providing a multi-functional mounting surface) also allows for attachment of the display board in either landscape mode or portrait mode.

Figure 5C:
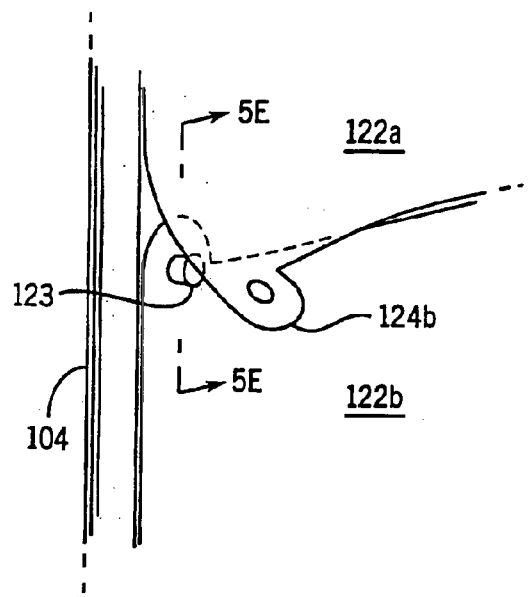
Figure 5D:
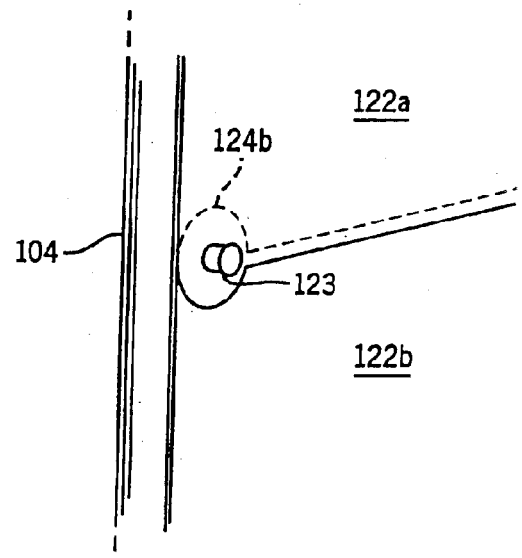
Figure 5E:
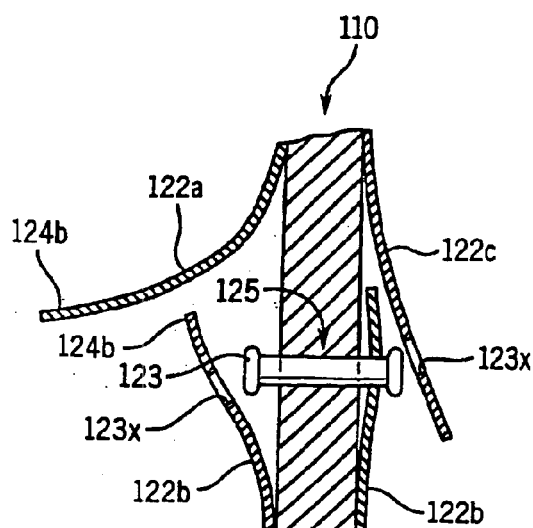
FIG. 5E is a sectional plan view of the display board of FIG. 5 taken at line 5E—5E in FIG. 5C.

As indicated, the surfaces of the display board may be provided with any of a wide variety of surface treatments, both functional and decorative, in a wide variety of combinations (i.e. one surface of a display board may have in whole or in part a different surface treatment than the other surface) and portions. According to any preferred embodiment, the surface treatment of the display boards will allow the display of one or more "layers" of information on each surface. In FIG. 1, display board 100 includes a writable surface 112 (e.g. a Melamine paper dry-erase or other "white board" surface); the other surface of the display board may have a reusable adhesive (e.g. "tacky" or repositionable posting surface treatment). As shown in FIGS. 5 and 6, display board 100 includes with a clear film cover 120 (e.g. overlay) over a tackable surface 112b (e.g. "photo album"). As shown, clear film cover 120 includes an upper sheet 122a and a lower sheet 122b; surface 112 (not shown in FIG. 5) beneath clear film cover 120 is provided with a light adhesive (e.g. "tackable", "tacky" or "sticky") surface treatment so that both upper sheet 122a and lower sheet 122b of clear film cover 120 and sheets of paper or other materials (e.g. "paper capture" for display beneath the clear film cover) will removably adhere to surface 112 (upper sheet and lower sheet may lift off in any direction or one, or three or more sheets may be provided according to alternative embodiments). According to a particularly preferred embodiment, each sheet of the clear film cover is made of a material that is "writable" (either permanently or erasably, i.e. reusably for a number of cycles). As shown in FIGS. 5, 5A and 5B, each sheet of clear film cover 120 may include a lifting tab 124a (FIG. 5A) that is of the same material as the sheet or a lifting tab 124b (FIG. 5B) that is of a different material or treatment than the sheet (e.g. a colored plastic flap that is more readily visible and non-adhesive). FIGS. 5C through 5E show a post 123 inserted into display board 100 that contacts with holes 123x to secure lifting tabs 124b (for upper sheet 122a and lower sheet 122b) to surface 112 of display board 100. Post 123 may be inserted on one side of the display board or (as shown in FIG. 5E) may be provided in a two-headed post 125 that extends through core 110 of display board 100.

According to a particularly preferred embodiment, the clear film cover is a dry-erase polyester film sheet of a 0.007 inch thickness with acrylic hardcoat and 90 percent gloss level commercially available from Tekra Corporation of New Berlin, Wis. under the name MARNOT™. The tacky surfaces for the display boards according to particularly preferred embodiments are of a type similar to the POST-IT™ memo board/bulletin board adhesive surface products commercially available from 3M Corporation of St. Paul, Minn.; "tackiness" is reduced from the typical range of 75–125 grams to a range of approximately 20–50 grams when used with display boards providing the clear film cover. Preferably, tacky (or "tackable") surface treatments will provide at least 250 cycles of "stick on" and "peel off" use (whether with the clear film cover or directly with sheets of paper or other material). According to an alternative embodiment shown in FIG. 6A, surface 112 of display board 100 is provided with a series of "tacky" (e.g. reusable adhesive) sections 112x sized and selectively arranged to reduce lift off force while maintaining higher tackiness; "tacky" sections could be in various shapes or patterns, such as stripes.

According to preferred embodiments, the display boards are provided in a variety of sizes, though typically in a rectangular shape suitable for use and display of information in either portrait mode or landscape mode. Typical sizes would include 34 by 46 inches or a half-size 22 by 34 inches, though many other sizes are available according to alternative embodiments. According to any particularly preferred embodiment, the display boards are sized to correspond to the standard delivery format of the materials from which they are assembled (e.g. roll widths or sheet sizes of film material or adhesive surfaces, etc.). (The core of the display board may also be provided in a variety of widths.)

FIGS. 14 through 16 show exemplary embodiments of accessories for use with one or more display boards. FIG. 14 shows a storage cup clip 190 including a cup-shaped receptacle 192 configured to contain markers 194 (shown in phantom lines) or the like. A clip portion 196 of storage cup clip 190 includes a pair of curved projections 198 shaped and sized to fit securely onto frame member 102 of display board 100. According to any preferred embodiment, the clip portion will be fit securely onto frame member (e.g. as to prevent undesired slipping or sliding along frame member when receptacle is loaded) but the curved projections will deform readily to allow both attachment and removal of the storage cup clip when desired. FIG. 15 shows a utility clip 200. Utility clip 200 provides two clip portions 202 each having a pair of curved projections 204 connected by a central web 206. Clip portions 202 are shaped and sized to fit onto frame member 102 of a display board 100b. As shown, utility clip 200 can be used to attach adjacent display boards 100a and 100b by their adjacent frame members (e.g. providing a display board "interlock"); alternatively, the utility clip can be used to attach a marker to a display board. According to any preferred embodiment, the clip portions of the utility clip are configured to securely attach to the frame member of the display board (or display boards) yet will readily allow for detachment. FIG. 16 shows a label clip 210 formed from a pair of curved projections 212 coupled by a flat web 214. A label 216 (e.g. a paper slip or the like) can be slid into a slot 218 formed by grooves 219 in web 214 and is held in place against frame member 102 by spring tension. As shown, label clip 210 fits securely (and removably) onto frame member 102 of display board 100 by spring tension and is made of a clear plastic material (e.g. styrene) so that label 216 is readily visible through flat web 214. According to any preferred embodiment, the clips are made of a compliant, spring-like material such as plastic, and will be provided with a mating profile, whether provided by projections or other engaging elements, that are suitably matched to the shape or construction of the corresponding frame or edge of the display boards to allow selectively for secure attachment and removal.

Referring to FIGS. 17 through 45, a variety of mounting structures for display boards are shown according to preferred and alternative embodiments of the present invention. The mounting structures are adapted to mount or stand the display boards on other structures, for example, floors, architectural walls, panel walls, systems furniture, other articles of furniture, etc. According to the preferred embodiments, the mounting structures are configured for display and use with (and storage of) the display boards shown and described in FIGS. 1 through 16. The variety of mounting structures that may be used with the display boards illustrates the flexibility and adaptability of display boards and their mounting interfaces. However, it is important to note that according to alternative embodiments that will be apparent to those who review this disclosure, the mounting structures can readily be adapted for use or interfacing (e.g. hanging, pivot mount, press fit, leaning, etc. in a variety of modes, such as landscape mode or portrait mode) with a wide variety of display boards having a wide variety of alternative sizes, shapes and constructions. It is also important to note generally that according to any preferred embodiment, the display board system is intended to promote and advance the efficient use, display and storage of information and layers of information on display boards (regardless of the format by which the information is placed on the display boards) through their mounting interfaces and associated mounting structures.

Figure 17:
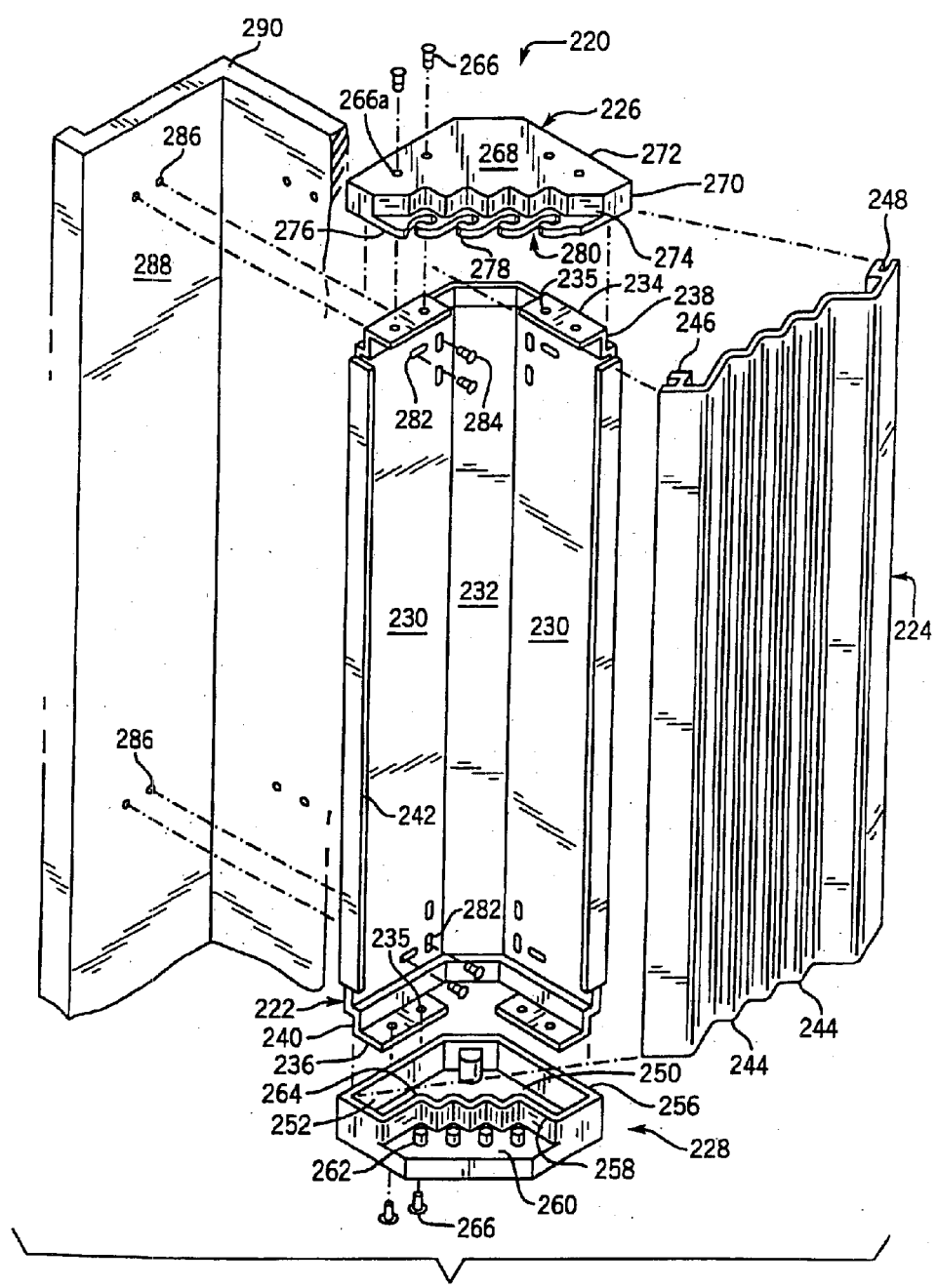
FIG. 17 is an exploded perspective view of a mounting structure for a display board system according to an exemplary embodiment of the present invention.

Referring specifically to FIG. 17, a mounting structure is shown as a rack 220. Rack 220 provides a pivotal mounting interface for display boards 100 (e.g. in the manner of a flip book with ready visibility of both surfaces of display boards 100). Rack 220 includes a center frame 222 and a cover 224; rack 220 also includes a cap 226 and a base 228 securing frame 222 and cover 224 into an integrated structure. Frame 222 includes two side walls 230 and a center wall 232. Side walls 230 of frame 222 each include a top mounting tab 234 and a bottom mounting tab 236, which project horizontally from an upper ledge 238 or lower ledge 240 at the top and bottom of frame 222, respectively. Each of side walls 230 of frame 222 also includes a vertical trim rail 242. According a particularly preferred embodiment, the center frame is integrally formed (e.g. folded) from sheet metal. Cover 224 includes a series of vertical corrugations 244 and has a vertical trim hook 246 within each lateral end forming a groove 248. Each vertical trim hook 246 of cover 224 is configured to engage corresponding vertical trim rail 242 of frame 222 (e.g. within groove 248), holding cover 224 onto frame 222. According to a particularly preferred embodiment, the cover is formed from an extruded plastic material. Base 228 includes a flat bottom 250 and a core 252

(above bottom) having rear and side walls 256 providing a profile configured to contain lower ledge 240 of center frame 222 and a front wall 258 providing a corrugated profile corresponding generally to corrugations 244 of cover 224 (slightly offset and larger). A horizontal ledge 260 including four vertical pegs 262 (e.g. rounded posts) extends from front wall 258 of base 228. Each bottom mounting tab 236 of frame 222 fits within core 252 of base; threaded mounting holes 235 in each bottom mounting tab 236 of frame 222 correspond to mounting holes 264 in core 252 to allow base 228 to be secured to frame 222 with threaded fasteners 266. Cap 226 includes a flat top 268 and a core 270 (beneath top 268) having rear and side walls 272 providing a profile configured to contain upper ledge 238 of center frame 222 and a front wall 274 providing a corrugated profile corresponding generally to corrugations 244 of cover 224 (slightly offset and larger). A horizontal plate 276 extends from front wall 274 of cap 226; horizontal plate 276 includes four curved hooks 278 forming four retaining slots 280 (having a narrowing retaining profile as shown). Each top mounting tab 234 of frame 222 fits within core 270 of cap 226; threaded mounting holes 235 in each top mounting tab 234 of frame 222 correspond to mounting holes 266a in core 270 to allow cap 226 to be secured to frame 222 with a threaded fastener 266 (or a thread forming fastener). According to a particularly preferred embodiment, the base and cap are formed from a plastic material.

According to any particularly preferred embodiment, the rack is adapted for mounting to a structure provided by a wall or other article (e.g. by any of a variety of conventional or other mounting arrangements). As shown in FIG. 17, each side wall 230 of center frame 222 of rack 220 contains a mounting arrangement shown as a pattern of mounting holes 282 (e.g. upper and lower set of adjustment slots) through which fasteners (shown as screws 284) are used to secure rack 220 in corresponding mounting holes 286 in a vertical structure shown as an architectural wall 288. As shown in FIG. 17, rack 220 is mounted into a corner 290 of architectural wall 288 and thus is mounted at each side wall 230 of frame 222. According to alternative embodiments, the rack can be mounted by one of its side walls against a single wall or structure providing a vertical frame, or by a wide variety of other mounting arrangements that will become apparent to those who review this disclosure; the pattern of mounting holes can be arranged to fit a wide variety of mounting structures, such as walls or frames.

Figure 18:
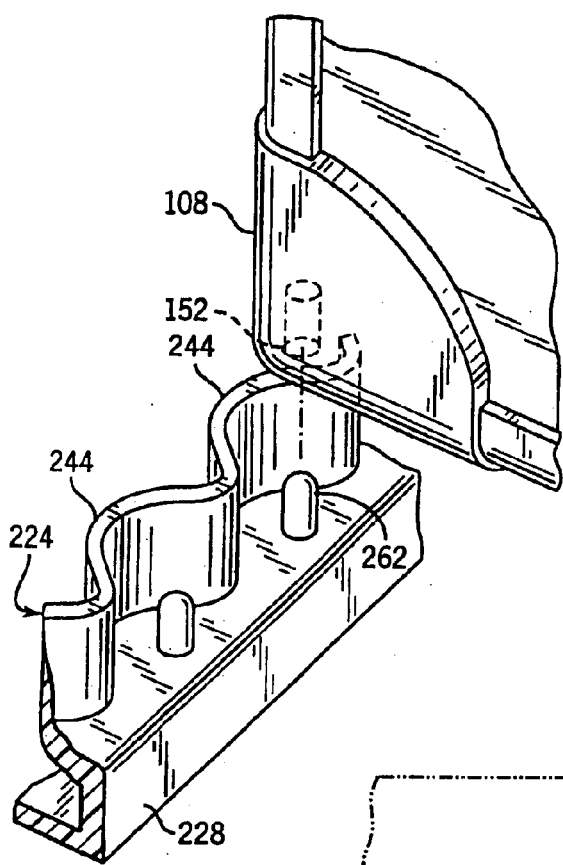
FIG. 18 is a fragmentary exploded perspective view of the mounting structure of FIG. 17 showing the installation of a display board.
Figure 20:
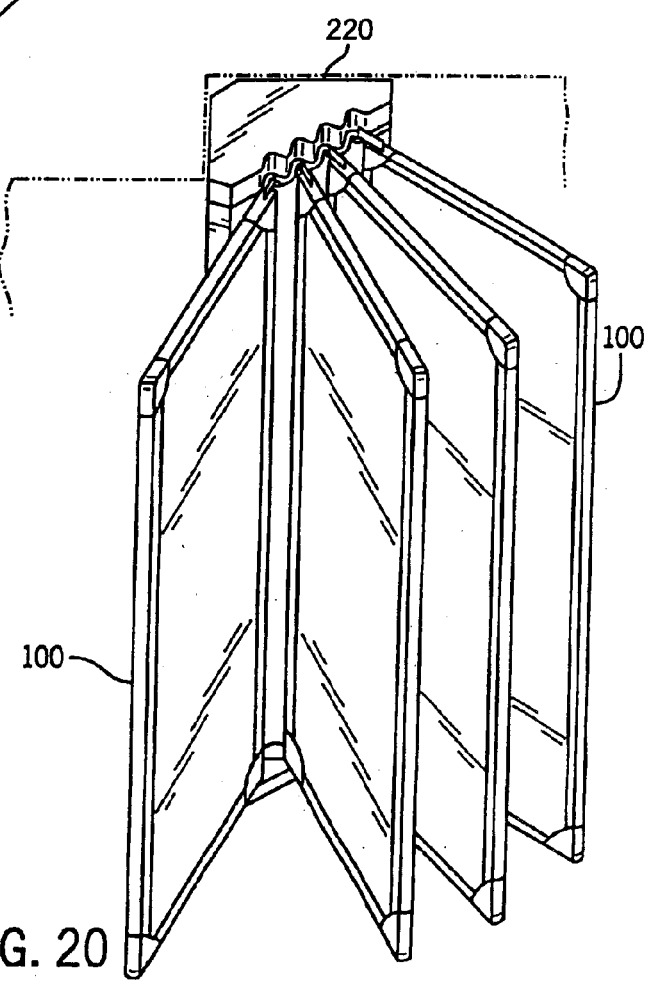
FIG. 20 is a perspective view of the mounting structure of FIG. 17 wherein a plurality of display boards have been installed.
Figure 19A:
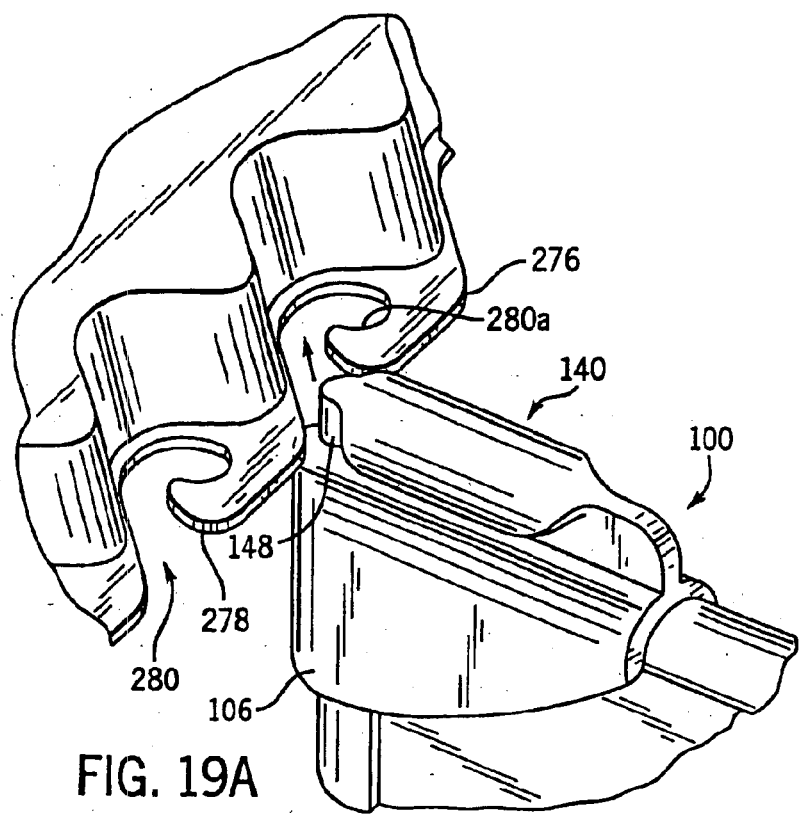
FIGS. 19A and 19B are fragmentary exploded perspective views of the mounting structure of FIG. 17 showing the installation of a display board.
Figure 19B:
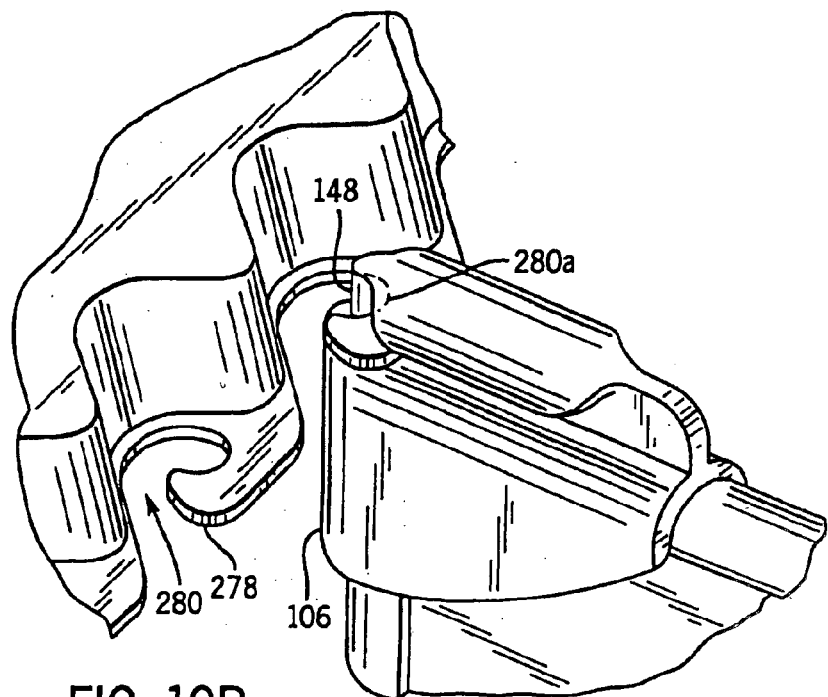

Referring to FIGS. 18 through 20, the interface between the display board system and rack 220 is shown. As is evident from FIG. 20, rack 220 provides a pivotal mounting interface for one or a plurality of display boards (four are shown as according to a particularly preferred embodiment, though according to alternative arrangements the mounting structure can provide for any number of display boards). In FIG. 18, peg 262 of base 228 of rack 220 is shown being engaged through an aperture 152 in bottom corner member 108 of display board 100. Corrugations 244 in cover 224 of rack 220 provide a guide (visual and physical) to assist the installation of display boards (e.g. to "find" peg). In FIGS. 19A and 19B, hook 278 and corresponding retaining slot 280 of cap 226 of rack 220 is shown being engaged by post 148 of top corner member 106 of display board 100. In FIG. 19A, post 148 is disengaged and at the relatively wide opening of retaining slot 280; in FIG. 19B, post 148 is engaged (e.g. "gripped") having been guided around hook 278, namely slid into and around the narrowing retaining profile of retaining slot 280, and into a secure, trapped (placement) fit at a terminus 280a of retaining slot 280 (e.g. terminus 280a has an inner diameter or profile slightly larger than an outer diameter of cylindrical post 148). The weight of the display board serves to retain the post in the terminus of the retaining slot in use (e.g. pivotal movement of the display board). According to alternative embodiments, the rack can be of a variety of sizes allowing for installation of a greater or lesser number of display boards (e.g. with more or less than four pegs and corresponding retaining slots).

Figure 21:
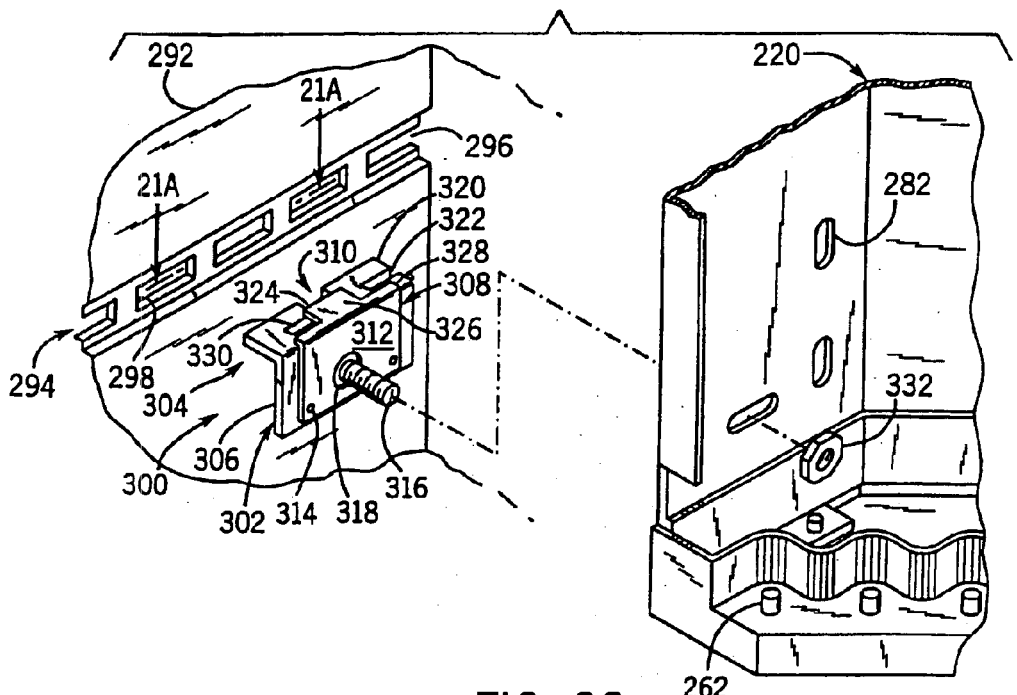
FIG. 21 is a fragmentary exploded perspective view of the mounting structure of FIG. 17 including a mounting arrangement according to an exemplary embodiment.
Figure 22:
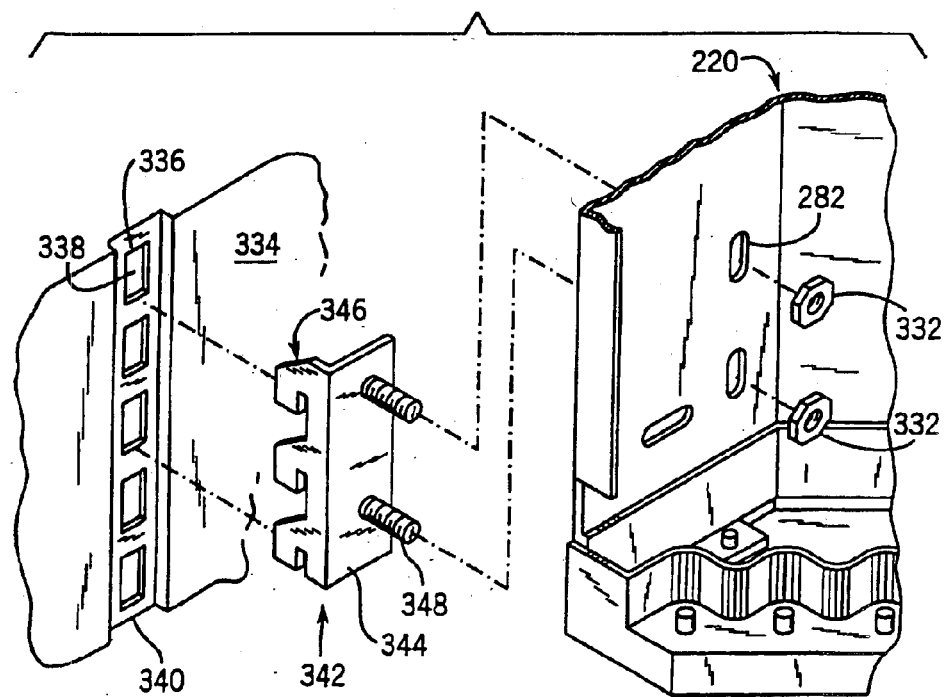
FIG. 22 is a fragmentary exploded perspective view of the mounting structure of FIG. 17 including a mounting arrangement according to an exemplary embodiment.

FIGS. 21 and 22 show exemplary mounting arrangements for securing rack 220 to a panel wall system. As shown in FIG. 21, panel wall 292 includes a horizontal slotted rail 294 including a repeating arrangement of slots 296 spaced apart by webs 298. A mounting bracket 300 is configured to mount rack 220 to panel wall 292. Mounting bracket 300 includes a base 302 (having a "L"-shaped profile with a top 304 and a side wall 306) and a spring clip 308 (also having a "L"-shaped profile with a top 310 and a side wall 312) that is joined to base 302 by welding or the like (e.g. two spot welds 314 are shown) so that the corresponding side walls are ordinarily maintained in facing contact under a holding or biasing force. A threaded rod 316 is joined to side wall 306 of base 302 and projects through an oversized aperture 318 in side wall 312 of spring clip 308. Top 304 of base 302 includes two hooks 320 each forming a retaining slot 322 separated by a gap 324; top 310 of spring clip 308 includes a tab 326 flanked by two flaps 328. Each hook 320 of base 302 of mounting bracket 300 is sized for insertion within slot 296 of horizontal slotted rail 294 of panel wall 292. As shown, a space 330 is formed between tab 326 and flap 328 of spring clip 308 within retaining slot 322 of hook 320 of base 302. Referring to FIG. 21A, mounting bracket 300 is shown inserted into horizontal slotted rail 294 prior to engagement; hooks 320 have been inserted into slots 296 (not shown) of horizontal slotted rail 294 and tab 326 of spring clip 308 rests against web 298 of horizontal slotted rail 294 so that the corresponding side walls 306 and 312 of base 302 and spring clip 308 have temporarily been urged apart. Referring to FIG. 21B, mounting bracket 300 has been securely engaged within horizontal slotted rail 294; the corresponding side walls of base 302 and spring clip 308 are in facing contact, and web 298 is retained within space 330 provided by mounting bracket 300. (Tab 326 thus secures mounting bracket 300 until spring clip 308 is separated (e.g. pried apart from base for deinstallation.) With mounting bracket 300 engaged within horizontal slotted rail 294 at the designated mounting points (e.g. upper and lower), rack 220 is cantilevered from panel wall 292. As shown, mounting between mounting bracket 300 and rack 220 is effected through a corresponding aperture (shown as a mounting slot 282 in FIG. 21) with a fastener (shown as a nut 332 in FIG. 21 to be threaded onto threaded rod 316).

Referring to FIG. 22, a mounting arrangement for securing rack 220 to a panel wall 334 having a vertical slotted rail 336 (providing a series of slots 338 spaced apart by webs 340) is shown. A mounting bracket 342 (of an "L"-shaped profile) has a base 344 and set of rearwardly projecting hooks 346 sized to fit into slots 338 and to engage webs 340 of vertical slotted rail 336; a pair of threaded rods 348 project forward from base 344 of mounting bracket 342. With mounting bracket 342 engaged within vertical slotted rail 336 at the designated mounting points (e.g. upper and lower), rack 220 is cantilevered from panel wall 334. As shown, mounting between mounting bracket 342 and rack 220 is effected through a corresponding aperture pattern (shown as mounting slots 282) with a set of fasteners (shown as a pair of nuts 332 to be threaded onto each threaded rod 348). According to a particularly preferred embodiment, the mounting bracket may include a spring clip or other locking member.

Figures 23B, 23C:
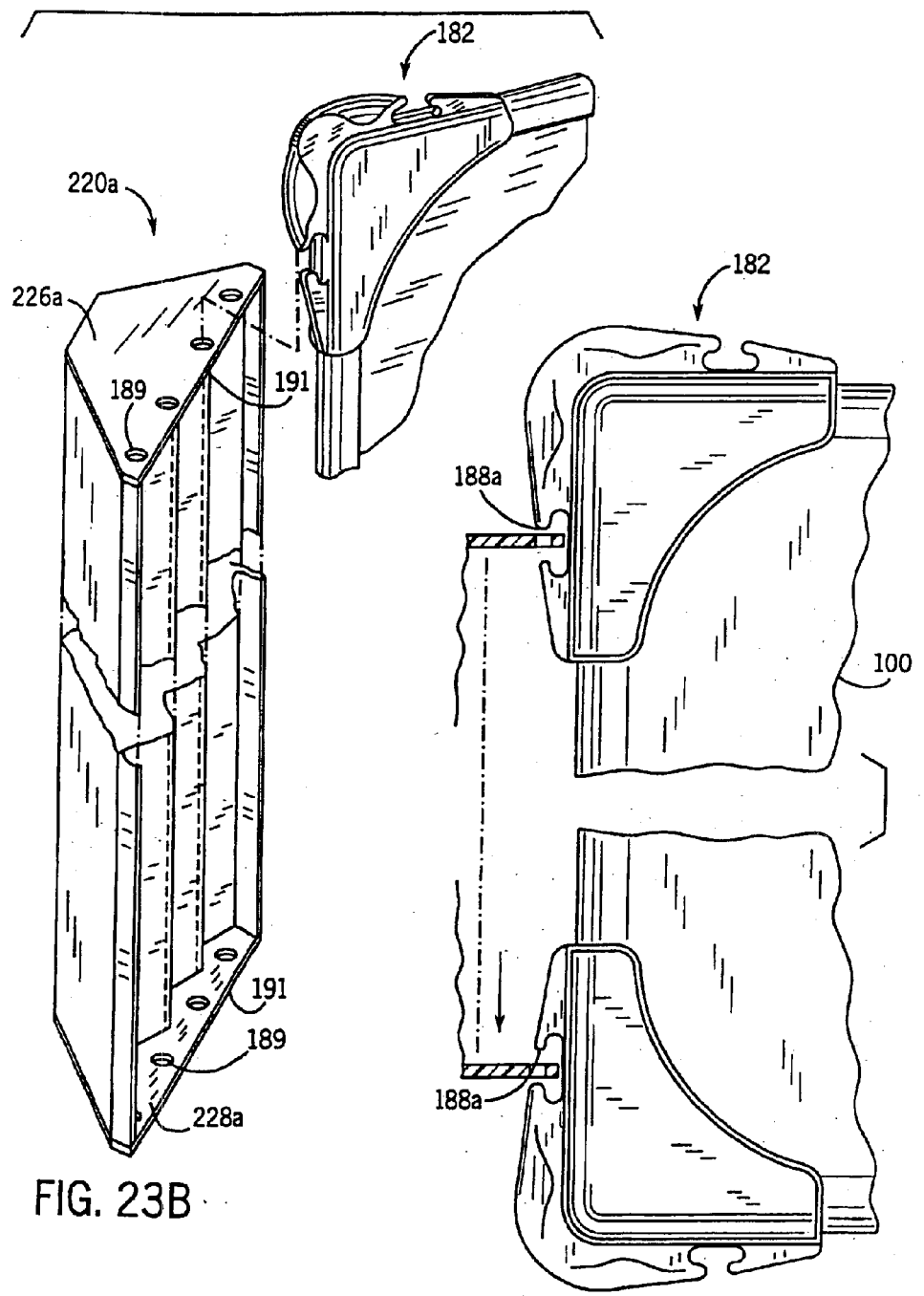
FIG. 23B is an exploded perspective view of a mounting structure for a display board system according to an alternative embodiment adapted to provide an interface for the display board of FIG. 13.
FIG. 23C is a fragmentary elevation view of the mounting structure of FIG. 23B.

Referring to FIGS. 23 and 23A, a storage tray 350 for a rack 220 is shown (along with a mounting interface). Storage tray 350 includes a horizontal floor 352 having a ledge or rim 354 and vertical walls (e.g. a back wall 356 and two side walls 358). Each of the vertical walls of storage tray 350 includes a vertical peg 360 that can be securely press fit into a corresponding aperture 362 in the bottom of base 228 of rack 220. When storage tray 350 is installed onto base 228 of rack 220 tools (shown in phantom lines as a marker 194 and an eraser 195) can be stored or removed through a front opening 366 between rim 354 and the bottom 364 of base 228. According to an alternative embodiment shown in FIGS. 23B and 23C, a modified rack 220a with cap 226a and base 228a providing apertures 189 from a web 191 accommodates the display board mounting interface shown in FIG. 13.

Referring to FIGS. 24 through 27, a mounting structure is shown as a rail system according to exemplary embodiments. Referring to FIG. 24, rail system 370 is adapted to provide a generally horizontal rail 372 (for hanging display boards 100 from a panel wall 374 or similar structure) having at each end a pivotal mounting interface shown as a self-adjusting hook assembly 376. Hook assembly 376 includes a hook 378 (formed from a horizontal cap 380 with a downwardly projecting peg 382) pivotally coupled to a end fitting 384 through a pivot post 386 (e.g. peg).

Figure 25D:
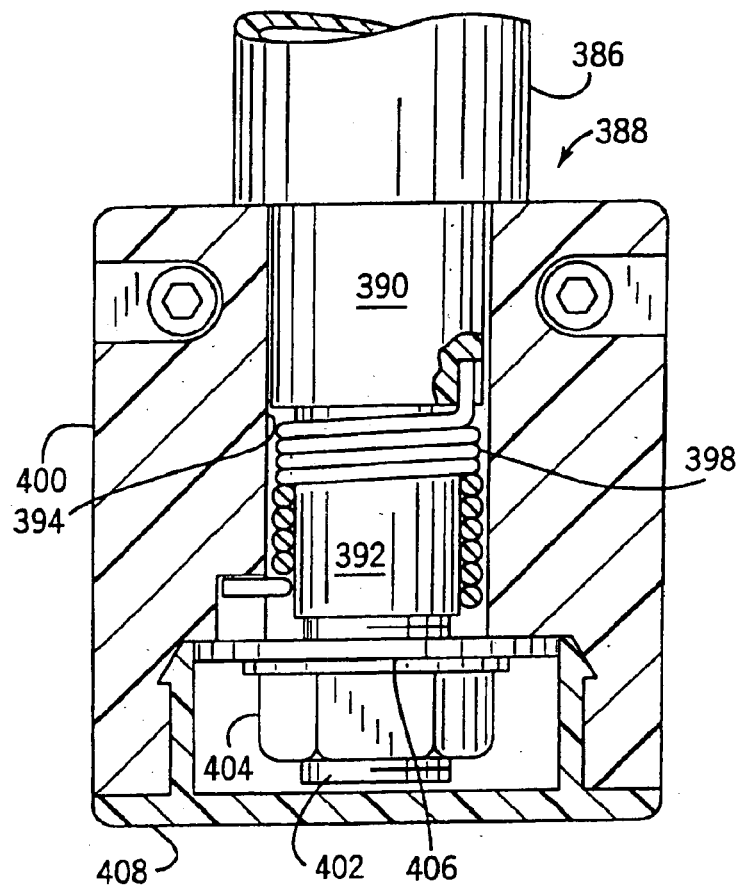
FIG. 25D is a fragmentary sectional elevation view of the mounting structure of FIG. 24 taken at line 25D—25D in FIG. 26A.
Figure 33G:
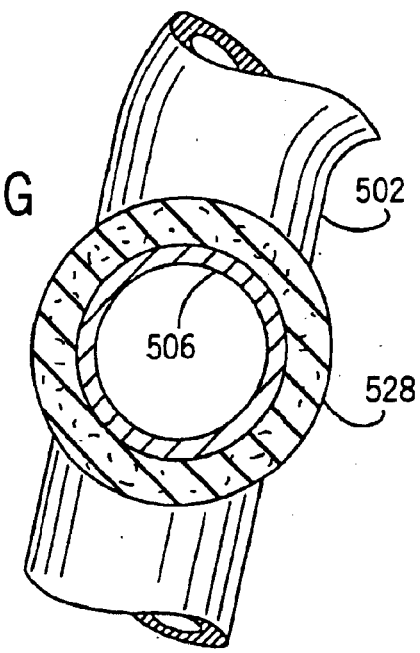
FIG. 33G is a sectional elevation view of a board pad of the mounting structure taken at line 33G—33G in FIG. 33A.
Figure 28:
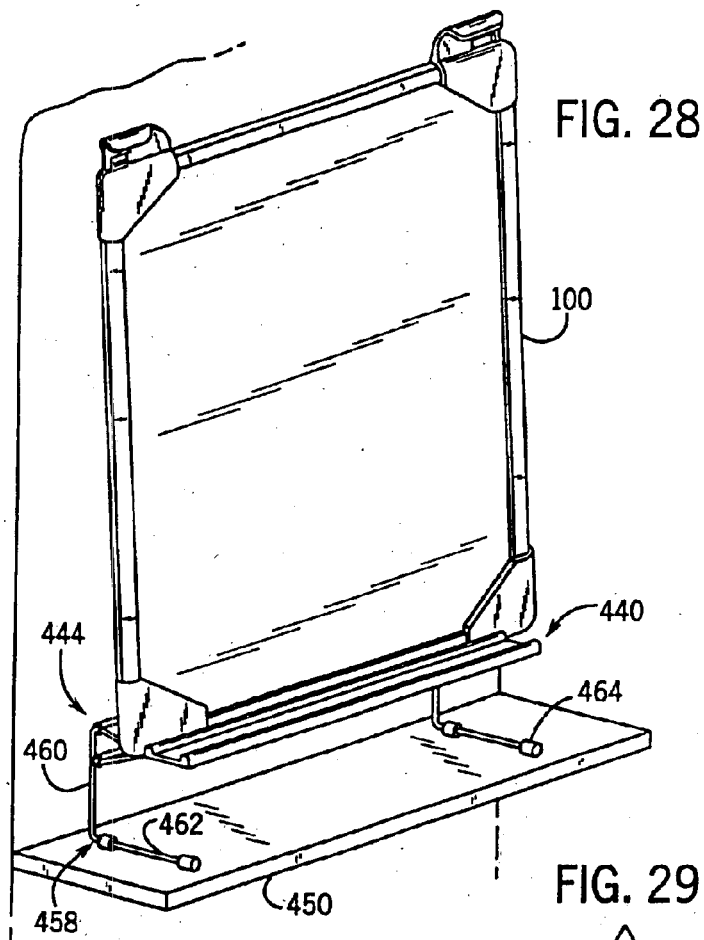
FIG. 28 is a perspective view of a mounting structure for a display board system according to an exemplary embodiment of the present invention.
Figure 29:
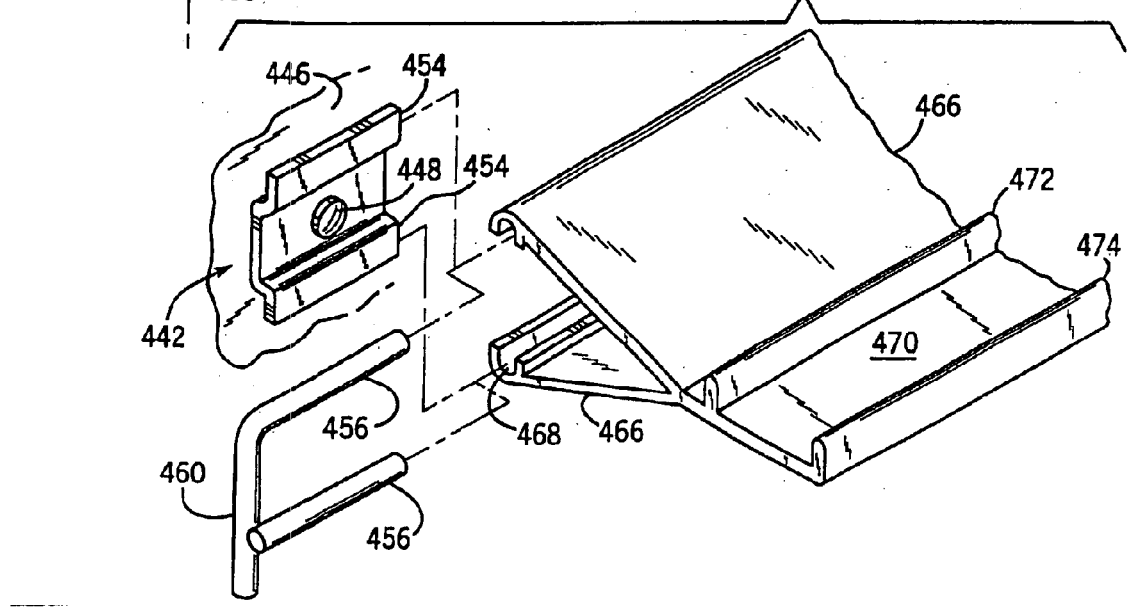
FIG. 29 is a fragmentary exploded perspective view of the mounting structure of FIG. 28.
Figures 33A, 33B:
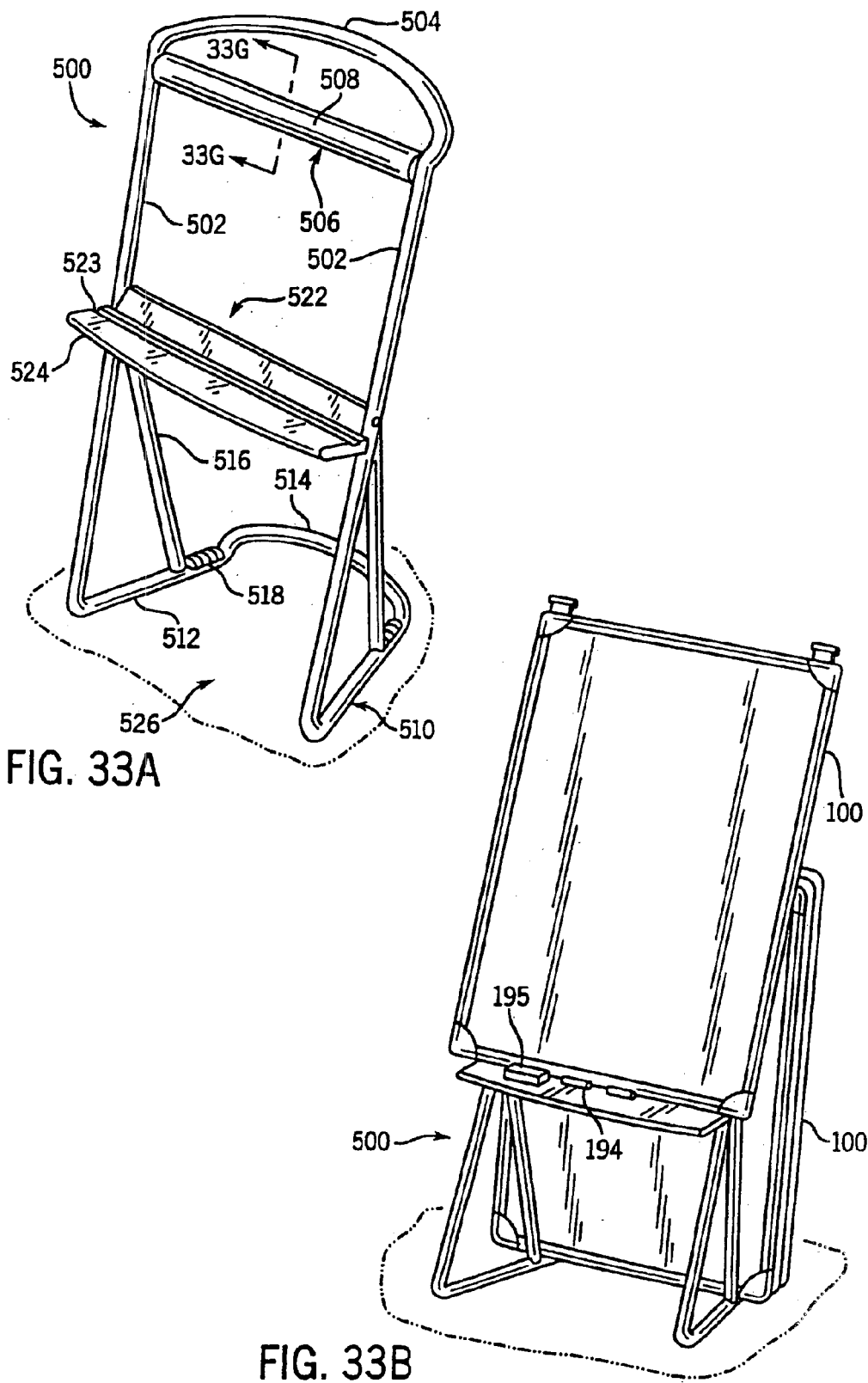
FIGS. 33A through 33C are perspective views of a mounting structure for a display board system according to an exemplary embodiment of the present invention.
Figure 33C:
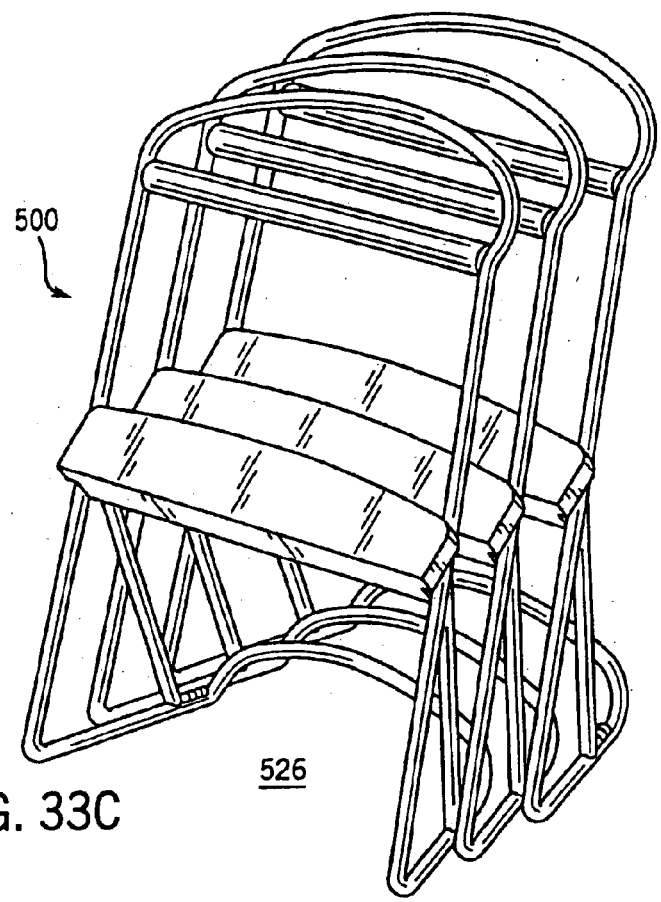
Figure 33D:
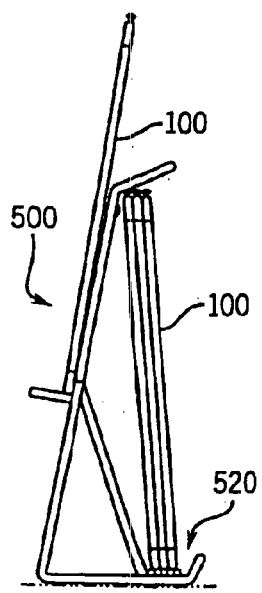
FIGS. 33D through 33F are side elevation views of the mounting structure of FIGS. 33A through 33C.
Figure 33E:
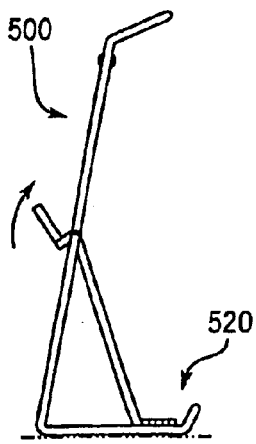
Figure 33F:
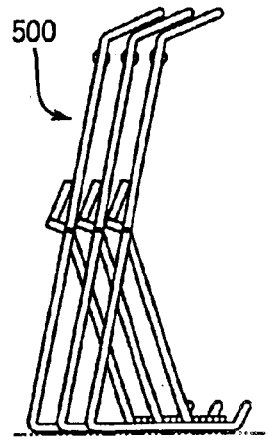

As shown in FIG. 25C, rail 372 is pivotally coupled to hook assembly 376. FIG. 25D shows the detail of the pivotal coupling of hook assembly 376 according to an exemplary embodiment. Pivot post 386 includes a double shoulder bolt 388 having an outer stage 390 and an inner stage 392 and fitted within an aperture 394 (e.g. collar) in end fitting. A torsion spring 398 is installed around and secured to outer stage of double shoulder bolt 388 at one end and secured within end fitting 396 at the other end. Inner stage 392 of double shoulder bolt 388 has a threaded end 402 and is secured within end fitting 400 by a locking nut 404 (with washer 406). An end cap 408 is fitted onto the base of end fitting 400 after inner stage 392 of double shoulder bolt 388 has been secured within end fitting 400 so as to allow pivotal movement of hook (not shown) with respect to end fitting 400 (through pivot post 386); torsion spring 398 is biased to tend to pivot the hook toward rail (e.g. pulling the peg into contact with the rail). According to the exemplary embodiments, hook assembly 376 is adapted to adjust to the width of the panel wall (or other structure) from which it is suspended (within a range defined by the reach or length of the hook). For example, hook assembly 376 is shown engaged with a relatively wide panel wall 374a in FIG. 25A and with a relatively thin panel wall 374b in FIG. 25B.

Referring to FIGS. 27 and 27A (and corresponding to FIGS. 25A through 25C), a single track rail 410 is shown with a corresponding hook assembly 376. Single track rail 410 has a generally "L"-shaped profile with a vertical base portion 412 and a horizontal rail portion 414 (projecting to one side along base portion 412). Rail portion 414 has a single track 416 with a retaining rim 418 at its leading edge. Hook assembly 376 includes an end fitting 384 secured to each end of single track rail 410 by fasteners shown as screws 420 extending through apertures 422a in end fitting 384 and threaded into corresponding apertures 422 in base portion 412 of single track rail 410. To suspend display board 100 from rail 410, hook 144 of corner member 106 of display board 100 is engaged within corresponding track 416 of rail 410 (see, e.g., FIG. 27). Referring to FIGS. 26 and 26A (and corresponding to FIG. 25D), a dual track rail 424 is shown with a corresponding hook assembly 426. Dual track rail 424 has an inverted "T"-shaped profile with a vertical base portion 428 and two horizontal rail portions 430 each providing a track 432 with a retaining rim 434 at its leading edge. Hook assembly 376 includes an end fitting 400 secured to each end of dual track rail 424 by fasteners shown as screws 420 extending through apertures 422a in end fitting 400 and threaded into corresponding apertures 422 in base portion 428 of dual track rail 424. To suspend one display board 100 from rail 424 hook 144 of corner member 106 of display board 100 (one or more) is engaged within corresponding track 432 of dual track rail 424 (see, e.g., FIG. 26).

Referring to FIGS. 28 through 31, a mounting structure is shown as a tray arrangement according to exemplary embodiments. As shown, tray 440 is configured for attachment to a mounting bracket 442 (which is mounted to a structure such as a wall 446 by a mounting screw 448) or to a mounting frame 444 (which is placed on a horizontal surface such as a shelf 450). Mounting bracket 442 is formed with a central mounting plate 452 having upper and lower tracks 454. Mounting frame 444 is a wire frame structure formed with upper and lower horizontal frame members 456 that span across right and left legs 458; legs 458 are of an "L"-shape each having a vertical frame member 460 and a horizontal support 462 (shown with cylindrical feet 464 installed). Tray 440 includes upper and lower arms 466, each having a groove 468 for engagement either with upper and lower tracks 454 of mounting bracket 442 or with upper and lower horizontal frame members 456 of mounting frame 444. Upper and lower arms 466 of tray 440 support a horizontal platform 470 having an inner vertical rim 472 and an outer vertical rim 474. When tray 440 is installed onto mounting bracket 442 or mounting frame 444 its upper and lower arms 466 with platform 470 form a sturdy support structure for a display board 100 (which will lean against a vertical structure such as wall 446 or another article and will stand on inner vertical rim 472); platform 470 forms a support structure for tools (not shown) such as markers or the like between inner vertical rim 472 and outer vertical rim 474. (According to a particularly preferred embodiment, the support structure is made of an extruded plastic material.) Referring to FIGS. 30 and 31, tray 440 is mounted to wall 446 with mounting brackets 442 (preferably at least two). Support of display boards 100 (two are shown) is augmented by a pair of horizontally projecting grips 476 mounted to wall 446. Grips 476 include a compliant grip portion compliant retaining members shown as 478 and a mounting flange 480 (secured to wall 446 by a fastener shown as screw 482 threaded into wall 446). Grips 476 are mounted to wall 446 at a spacing that is essentially identical to the width of display board 100; when display board 100 is press fit between grips 476 a holding force is provided against frame members 102 of display board 100 by each contacted compliant grip portion 478 of grips 476 (which deform slightly). According to a particularly preferred embodiment, compliant grip portion 478 includes a series of deformable fins 484 and is made of an elastomeric material so that display board is securely held but conveniently removed. The holding force provided by the grips may be adjusted by variations in the shape and profile of the grip portions (e.g. the thickness and spacing of the deformable fins, if fins are employed), as well as the material of construction, the spacing distance of mounting to the wall, etc. according to alternative embodiments.

Referring to FIG. 32, a mounting structure is shown as a mat according to an exemplary embodiment. Mat 490 provides a top surface 492 having a series of vertically projecting guides 494 (shown as having varying heights) and a bottom surface 496 given a non-skid surface treatment (according to any conventional method). When mat 490 is installed on a horizontal surface such as a work surface or shelf 450 (as shown), it provides at one or more of its projecting guides 494 a stand or support for the base of a display board 100 (shown in phantom lines) leaning against a vertical structure (shown in phantom lines as a wall). Other of the projecting guides may serve as holders for tool such as markers or the like. According to any particularly preferred embodiment, the mat is made of a rubber or plastic material.

Referring to FIGS. 33A through 40, a mounting structure is shown as an easel (e.g., stand or cart) according to exemplary embodiments. According to any preferred embodiments, each of the easels is formed from a welded steel tube structure, although other materials may be used according to alternative embodiments. A nesting easel 500 is shown in FIGS. 33A through 33G. Nesting easel 500 is a rigid structure having a pair of substantially upright rearwardly tilted side frame members 502 coupled to a curved back or handle member 504 and to a horizontal cross member 506 covered by a board pad 508. Side frame members 502 are coupled to a base 510. Base 510 has a pair of legs 512 coupled by a center portion 514 (providing base 510 with a tapering "V"/"U"-shaped profile) and a pair of substantially upright forwardly tilted support frame members 516. At the junction of each leg 512 and center portion 514 of base 510 a support pad 518 (e.g. of a compliant or elastomeric material) is provided; tapered center portion 514 of base 510 is raised to provide a capturing lip 520. A folding tray assembly 522 including a (plastic) tray 524 (of an "L"-shaped profile) is pivotally coupled across side frame members 502 (e.g. by a bolt or other conventional pivotal mounting arrangement); tray assembly can be pivoted from a deployed position (shown in FIG. 33A) to a stowed position (shown in FIG. 33C). A display board 100 rests on tray 524 (with a retaining groove 523) and against board pad 508 for display (as shown in FIGS. 33B and 33D); an exposed portion of tray 524 is available for holding tools such as markers 194 and erasers 195. Display boards 100 not in use can be stored in base 510 of easel 500 (as shown in FIGS. 33B and 33D) resting on support pads 518 and against board pad 508; capturing lip 520 of base 510 will serve to keep leaning display boards 100 within base 510. As is shown in FIGS. 33C and 33F, after tray assembly 522 has been stowed, open front portion 526 of base 510 of one easel can be fitted onto tapered center portion 514 of base 510 of an adjacent easel so that one easel can be nested into the adjacent easel in a repeating pattern. According to a particularly preferred embodiment, as shown in FIG. 33G, board pad, which is intended to prevent damage or marring of the display boards, is made of a neoprene wrap 528 fitted over cross member 506.

Figures 34C, 34D, 34E:
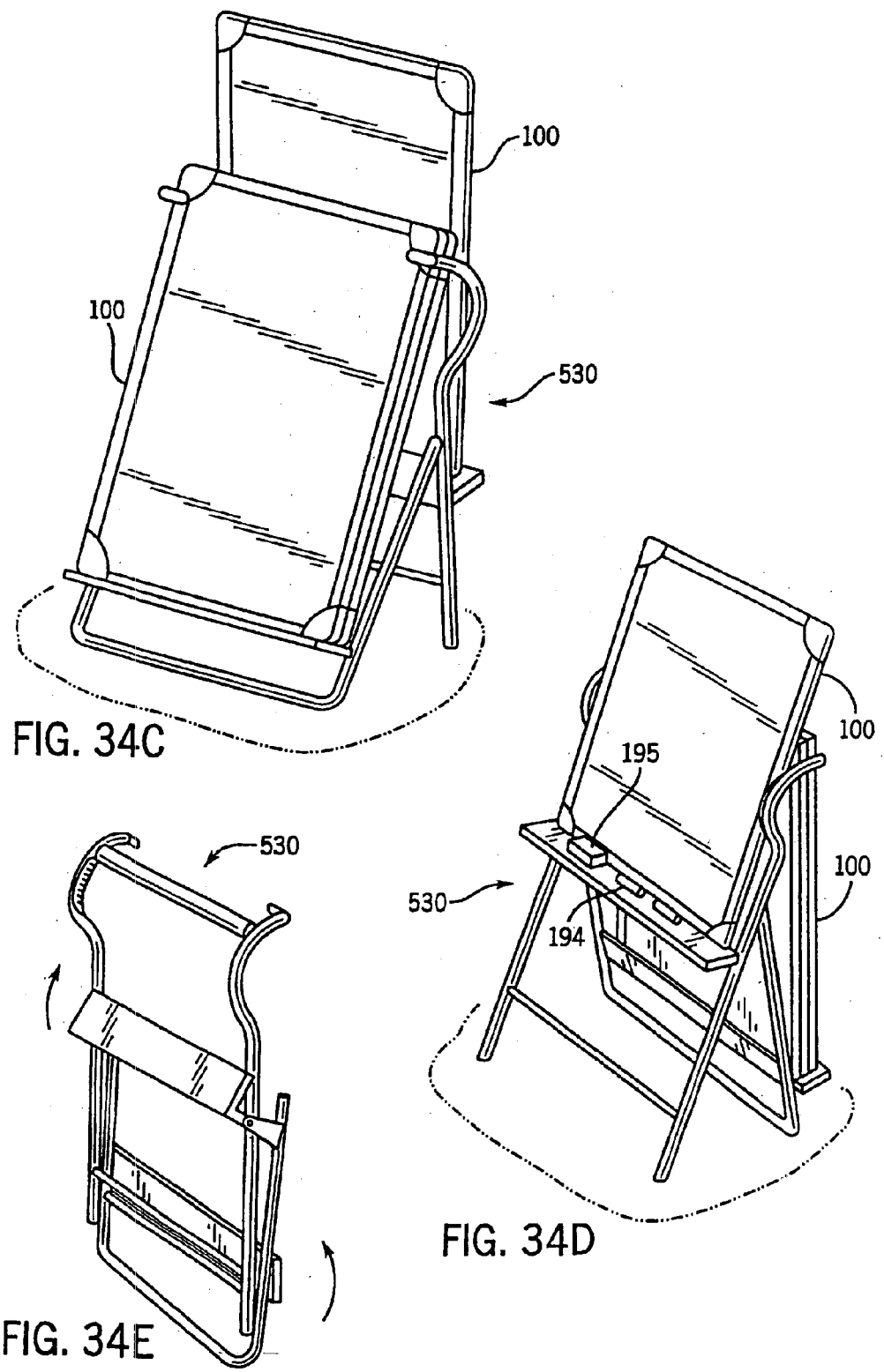
FIGS. 34C through 34E are perspective elevation views of the mounting structure of FIG. 34A.
Figure 35:
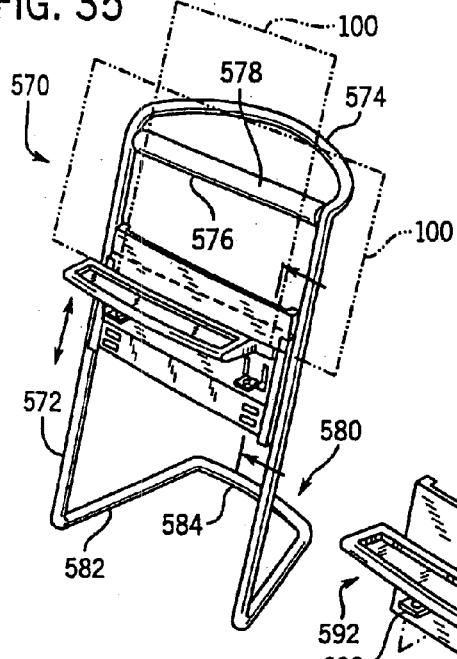
FIG. 35 is a perspective view of a mounting structure for a display board system according to an exemplary embodiment of the present invention.
Figure 36:
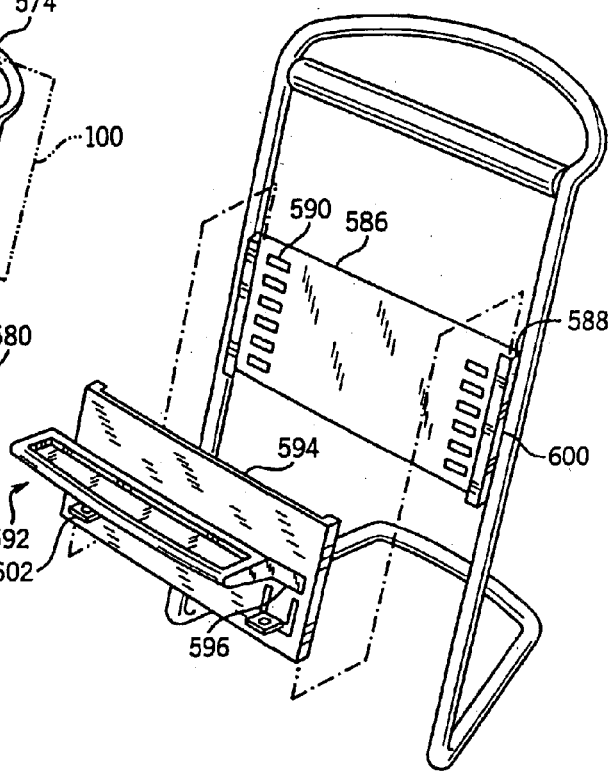
FIG. 36 is an exploded perspective view of the mounting structure of FIG. 35.
Figure 37A:
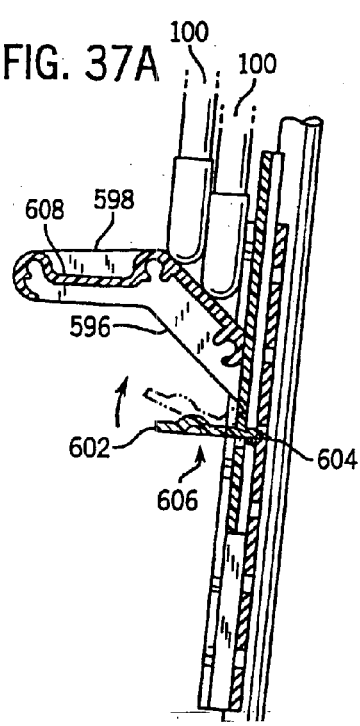
FIGS. 37A and 37B are fragmentary sectional elevation views of the mounting structure of FIG. 35.
Figure 37B:
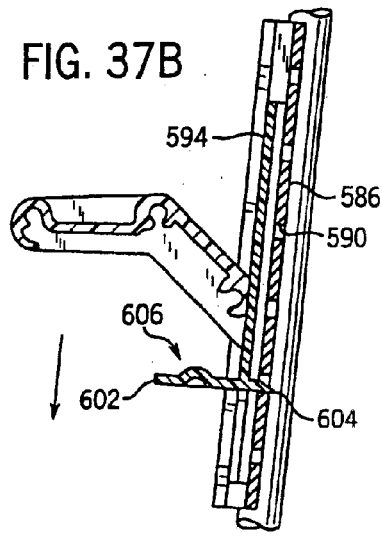

A folding easel 530 is shown in FIGS. 34A through 34E. Folding easel 530 is a rigid structure having a pair of substantially upright rearwardly tilted side frame members 532 coupled to an upper horizontal cross member 534 covered by a board pad 528 and a lower horizontal cross member 536. Side frame members 532 have a curved upper portion 538. A folding base 540 is pivotally coupled to side frame members 532. Folding base 540 includes a pair of support arms 542 and a center member 544 (e.g. folding base 540 has a "U"-shaped profile). Support arms 542 of folding base 540 include a projecting tab 546 for pivotal coupling to side frame member 532. At each curved upper portion 538 of side frame members 532 a compliant retaining system including a grip 548 (e.g. of a compliant or elastomeric material) having deformable fins 550 (e.g. ribs) is provided. At each of upper exposed ends 552 of side frame members 532 a flexible flap 554 (e.g. of a compliant or elastomeric material) is provided (see FIG. 34B) to form a holding area 556 for display boards 100 (shown in phantom lines). An upper folding tray assembly 558 (with a retaining groove 557) including a plastic tray 559a (of an "L"-shaped profile) is pivotally coupled across side frame members 532, as shown in FIG. 34E, along with folding base 540 through tabs 546. A lower folding tray assembly 560 including a plastic tray 559b (e.g. substantially identical to plastic tray 559a of upper folding tray assembly 558) is pivotally coupled across support arms 542 of folding base 540. According to any preferred embodiment, the pivotal couplings are effected by bolts or other conventional pivotal mounting arrangements. Upper and lower tray assemblies 558 and 560 can be pivoted from a deployed position (shown in FIG. 34A) to a stowed position (shown in FIG. 34E). A display board 100 rests on upper tray 559a and against board pad 528 for display. As shown in FIG. 34D, display board 100 is securely held between grips 548; an exposed portion of upper tray 559a is available for holding tools such as markers 194 and erasers 195. Display boards 100 not in use can be stored in holding area 556 of easel 530 resting on lower tray 559b and against board pad 528 or against adjacent display boards (as shown in FIGS. 34C and 34D). Flexible flaps 554 will serve to keep leaning display boards within base 540. As is shown in FIG. 34C, at least one of the display boards stored in holding area 556 is also visible from the rear of easel 530. When folding easel 530 is not in use, as shown in FIG. 34E, upper and lower tray assemblies 558 and 560 can be stowed and folding base 540 can be folded onto to side frame members 532, forming a compact structure.

An adjustable easel 570 is shown in FIGS. 35 through 37B. Easel 570 is a rigid structure having a pair of substantially upright rearwardly tilted side frame members 572 coupled to a curved back or handle member 574 and to a horizontal cross member 576 covered by a board pad 578. Side frame members 572 are coupled to a base 580. Base 580 has a pair of legs 582 coupled by a center portion 584 (providing base 580 with a tapering "U"-shaped profile). A tray support plate 586 is coupled across side frame members 572. Plate 586 includes at each lateral side a track 588 and a pattern of adjustment slots 590. An adjustable tray assembly 592 including a base frame 594 having an arm 596, from which extends a horizontal tray 598, is adjustably mounted to plate 586 across side frame members 572. Base frame 594 of tray assembly 592 includes at each lateral side a guide block 600 which fits within corresponding track 588 of plate 586 to allow for guided vertical movement of tray assembly 592 with respect to plate 586. Base frame 594 of tray assembly 592 also includes at each lateral side a locking member formed as a releasable tab 602 (e.g. a "finger release"). Each locking member 602 includes a rearward projection 604 that is biased into a position that will engage any adjacent corresponding adjustment slot 590 of plate 586 as tray assembly 592 is guided vertically within track 588 of plate 586. When projection 604 is engaged in any corresponding adjustment slot 590, tray assembly 592 is retained in the corresponding vertical position with respect to plate 586 (see FIG. 37B). Each locking member also includes a release lever 606; lifting of release lever 606 disengages projection 604 from adjustment slot 590 and frees tray assembly 592 for vertical movement with respect to plate 586 (see phantom line disclosure in FIG. 37A). Vertical adjustment of the position of tray assembly 592 with respect to plate 586 is therefore defined by the pattern of adjustment slots within plate 586, each adjustment slot providing a discrete vertical position for tray assembly. A display board 100 (shown in phantom lines in both landscape and portrait mode in FIG. 35) rests on arm 596 of tray assembly 592 and against board pad 578 for display or use. Tray 598 which includes a base depression 608 is available for holding tools such as markers and erasers (not shown). According to any particularly preferred embodiment, the easel is made of a welded steel structure and the tray assembly is formed from a plastic material.

Figure 38:
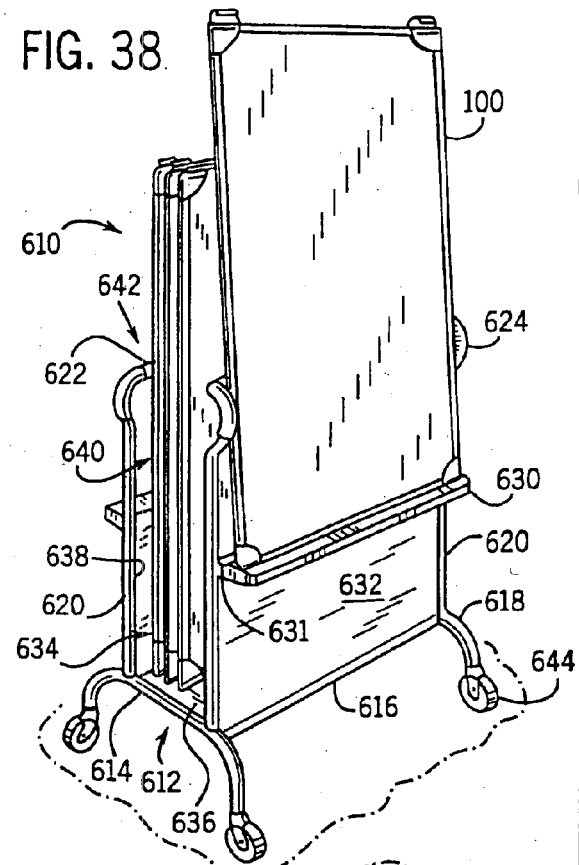
FIG. 38 is a perspective view of a mounting structure for a display board system according to an exemplary embodiment of the present invention.
Figure 39:
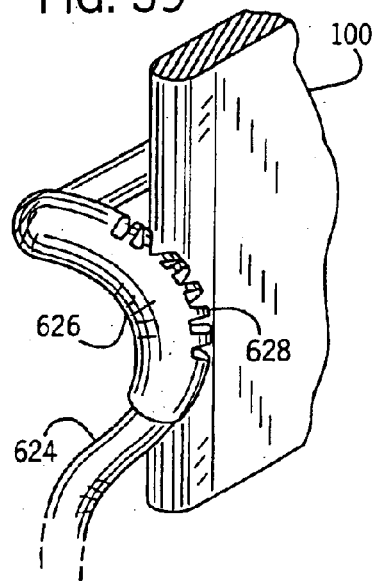
FIG. 39 is a fragmentary perspective view of the mounting structure of FIG. 38 showing a mounting arrangement for a display board.

A mobile easel 610 is shown in FIGS. 38 and 39. Mobile easel 610 is a generally rigid and symmetrical structure including a generally rectangular base frame 612 having relatively short horizontal side cross members 614 (one is visible in FIG. 38) and relatively long horizontal front (or lower) cross members 616 (one is visible in FIG. 38). Base frame 612 also includes four curved legs 618 (three are visible in FIG. 38) and two sets of generally vertical support frame members 620 (three are visible in FIG. 38). Each set of support frame members 620 is coupled by a horizontal upper cross member 622 (parallel to a corresponding lower cross member 616 of base frame 612). Each support frame member has a curved upper portion 624. At each curved upper portion 624 of support frame members 620 a compliant retaining system (or compliant member) shown as a grip 626 (e.g. of a compliant or elastomeric material) having deformable fins (or ribs) 628 is provided. A horizontal tray assembly 630 (with a retaining groove 631) is installed across each set of support frame members 620 at a location between upper cross member 622 and lower cross member 616. A folded panel 632 (e.g. a sheet metal panel folded into a rectilinear "U"-shaped profile) is mounted between base frame 612 and each set of support frame members 620 (below each tray assembly 630) to form a stowing area 634 for display boards 100 between each set of support frame members 620. A display board 100 may rest on each tray assembly 630 and upper cross member 622 (which may be covered with a board pad) for display or use. As shown in FIGS. 38 and 39, display board 100 is securely held between grips 626; an exposed portion of each tray assembly 630 is available for holding tools such as markers 194 and erasers 195 (not shown). Stowing area 634 is provided with a floor 636 and walls 638 (by panel 632) for secure storage of display boards 100 that are not in use. However, stowing area 634 also has open ends 640 and an open top 642 to allow insertion and removal of display boards 100 in an accessible and convenient fashion. Mobile easel 610 includes rotatable wheels 644 on each of four curved legs 618, installed by known and conventional arrangements according to any preferred embodiment (e.g. with either all four wheels free to turn or with two straight wheels, etc.).

Figure 40:
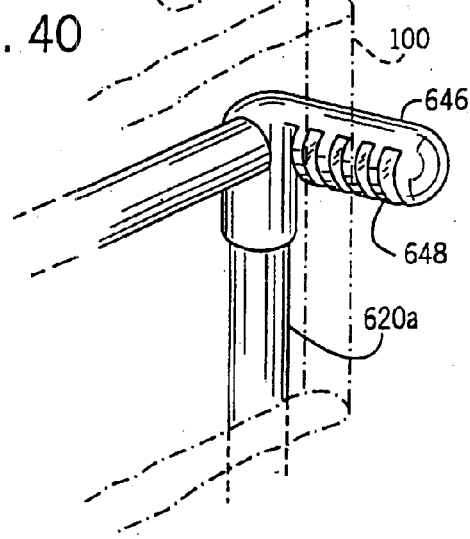
FIG. 40 is a fragmentary perspective view of a mounting structure for a display board system showing a mounting arrangement for a display board according to an alternative embodiment of the present invention.

FIGS. 39 and 40 show arrangements for the compliant retaining system according to exemplary embodiments. As shown in FIG. 39, curved grip 626 installed on upper curved portion 624 of support frame member 620 (e.g. rail) of the easel includes fins 628 (e.g. ribs) that deform when a display board 100 is press fit into display on the easel (to a shape and extent determined by the position of the display board within the grip) to secure display board 100 to the easel for working and use (e.g. display, writing, erasing, configuring, transport with a mobile easel, etc.). As shown in FIG. 40, according to an alternative embodiment, a grip peg 646 is installed at the interference of vertical support frame member 620a and horizontal upper cross member 622a and horizontal cross member 622 of the mounting structure (e.g. easel). Grip peg 646 also includes fins 648 (e.g. projections, ribs or fingers, etc.) that deform to secure a display board 100 (shown in phantom lines) to the easel for use; as is evident, fins 648 are thicker than shown in FIG. 39. As will become apparent to those who review this disclosure, a wide variety of compliant materials may be used for the grips, which according to alternative embodiments may be in a variety of shapes and may or may not include deformable fins (e.g. projections, ribs). According to the preferred embodiments, the grips are made of a compliant material that is soft and durable and can be formed by molding, such as an elastomer or plastic. According to any particularly preferred embodiment, the grips include a series of deformable fins and are formed from an elastic material so that each display boards is securely held but may conveniently be removed without damage or marring. The holding force and stiffness provided by the grips may be adjusted by variations in the shape and profile of the grips (e.g. the thickness and spacing of the deformable fins, if fins are employed), as well as the material of construction, location of the grips, orientation of the grips, the spacing distance of the grips, or number of grips (e.g. one or more), etc., according to alternative embodiments.

Figure 41:
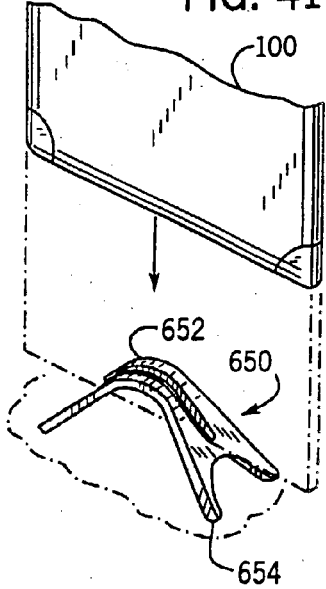
FIG. 41 is an exploded perspective view of a mounting structure for a display board system according to an exemplary embodiment of the present invention.

Referring to FIG. 41, a mounting structure is shown as a stand 650 according to an exemplary embodiment. Stand 650 is formed as a unitary structure and is of a generally symmetrical shape. Stand 650 includes a slot 652 for holding a display board 100 and four legs 654 arranged to provide a relatively stable base for display of display board 100. According to a particularly preferred embodiment, the stand is formed from a molded plastic material (e.g. blow molded). As shown, stand 650 has a shape that allows for stacking of one or more additional stands on top of each other.

Referring to FIGS. 42 through 45, a mounting structure is shown as an articulating frame system according to exemplary embodiments. As shown in FIGS. 42 through 45, the articulating frame system can be configured to include a rack of a type shown in FIG. 17 to allow for display and use of display boards. (According to alternative embodiments, display boards may interface with the articulating frame system by any of a wide variety of other mounting structures and methods, including those shown in other Figs.) Referring to FIG. 44, an articulating frame 670 includes a pair of vertical frame members 672 and 674 coupled by a horizontal upper cross member 676, a horizontal intermediate cross member 678, and a horizontal lower cross member 680 (e.g. each member preferably being a rectangular steel tube welded to form the structure). A base panel 682 or cladding is fastened (e.g. by threaded fasteners 684) to intermediate and lower cross members 678 and 680. Vertical frame member 672 is provided with a pair of hinge blocks 684 (upper) and 686 (lower), each configured to receive a hinge pin 688 (upper) and 690 (lower). Upper hinge pin 688 is secured to a wall 692 (or other structure) by a mounting bracket 694; lower hinge pin is secured to (or stands on) a floor 696 on a circular foot 698; upper and lower hinge pins share a pivotal axis 700. Vertical frame member 674 includes a wheel assembly 702 at its base. Wheel assembly 702 includes a frame 704 and an axle 706 retaining a wheel 708 for rotation; wheel assembly 702 is mounted to base of vertical frame member 674 by threaded fasteners 710 (e.g. screws). A rack 220 is mounted to vertical frame member 674 (and alternatively also to vertical frame member 672) so that display boards can be installed for use and display. Two handles 712 are also mounted to vertical frame member 674. Articulating frame 670 is configured for pivotal movement (e.g. with respect to wall 692 or another structure) about axis 700 rolling along wheel 708 in a range of motion between a fully stowed position and a fully deployed position. Referring to FIGS. 42, 43 and 45, an articulating frame system 720 including two articulating frames 722 and 724 is shown. Each articulating frame 722 and 724 includes two racks 220*a* and 220*b*. Each of racks 220*a* and 220*b* includes four display boards 100. In FIG. 42, each articulating frame 722 and 724 is stowed, but display boards 100 are deployed. In FIG. 43, each articulating frame 722 and 724 is deployed, but display boards 100 are stowed. In FIG. 45, each articulating frame 722 and 724 is stowed in a space frame 726 (shown in phantom lines), but certain display boards 100*a* and 100*b* are partially deployed. As will become evident to those who review this disclosure, a wide variety of configurations are possible for the articulating frame system, employing variations of size, shape, orientation, arrangement, mounting structures, etc., as well as variations in the deployment of display boards.

It is important to note that the use of the term "display board" is not meant as a term of limitation, insofar as any "board" or like structure having a decorative or functional use or application is intended to be within the scope of the term. The use of the term "display board" is intended as a convenient reference for any such "board" or structure, which may also be viewed synonymously with the term "work board" or other like terms. It is also important to note that the use of the term "information" is meant to cover any use of any type of media that can be associated with a display board (or work board).

Although only a few exemplary embodiments of the present invention have been described in detail in this disclosure, those skilled in the art who review this disclosure will readily appreciate that many modifications are possible in the exemplary embodiments (such as variations in sizes, structures, shapes and proportions of the various elements, values of parameters, mounting arrangements, or use of materials) without materially departing from the novel teachings and advantages of the invention. Accordingly, all such modifications are intended to be included within the scope of the invention as defined in the appended claims. Other substitutions, modifications, changes and omissions may be made in the design, operating conditions and arrangement of the preferred embodiments without departing from the spirit of the invention as expressed in the appended claims.

What is claimed is:

1. A mounting structure comprising:
   at least one display board including a first mounting interface and a second mounting interface;
   a first pivotal interface including a first projection forming a retaining slot adapted to engage the first mounting interface of the display board wherein the first projection is a hook; and
   a second pivotal interface adapted to engage the second mounting interface of the display board;
   so that the display board is adapted to be removably pivotally coupled to the mounting structure at both the first pivotal interface and the second pivotal interface.

2. The mounting structure of claim 1 wherein the second pivotal interface includes a second projection having a post.

3. The mounting structure of claim 1 wherein the second pivotal interface is adapted to be generally coaxial with the second mounting interface.

4. The mounting structure of claim 1 wherein the first pivotal interface is configured to at least partially grip the first mounting interface of the display board.

5. The mounting structure of claim 1 further comprising a cap having the first pivotal interface and a base having the second pivotal interface.

6. The mounting structure of claim 5 further comprising a frame coupling the cap to the base.

7. The mounting structure of claim 6 wherein the frame is adapted for mounting to an existing structure.

8. The mounting structure of claim 6 further comprising a cover fitted over the frame.

9. The mounting structure of claim 5 wherein the cap includes a plurality of first pivotal interfaces and the base includes a second pivotal interface for each of the first pivotal interfaces so that the mounting structure is adapted to receive and support a plurality of display boards.

10. The mounting structure of claim 1 wherein the first and second pivotal interfaces are generally coaxial.

11. The mounting structure of claim 1 wherein the second pivotal interface is disposed below the first pivotal interface.

12. A mounting structure comprising:
    at least one display board including a first mounting interface and a second mounting interface;
    a first pivotal interface including a first projection forming a retaining slot adapted to engage the first mounting interface of the display board; and
    a second pivotal interface adapted to engage the second mounting interface of the display board wherein the second pivotal interface includes a second projection having a post;
    so that the display board is adapted to be removably pivotally coupled to the mounting structure at both the first pivotal interface and the second pivotal interface.

13. The mounting structure of claim 12 wherein the retaining slot of the first pivotal interface includes a retaining profile with a terminus for securing the first mounting interface of the display board.

14. The mounting structure of claim 12 further comprising a cap having the first pivotal interface and a base having the second pivotal interface.

15. The mounting structure of claim 14 wherein the cap includes a plurality of first pivotal interfaces and the base includes a second pivotal interface for each of the first pivotal interfaces so that the mounting structure is adapted to receive and support a plurality of display boards.

16. The mounting structure of claim 14 further comprising a frame coupling the cap to the base.

17. The mounting structure of claim 16 wherein the frame is adapted for mounting to an existing structure.

18. The mounting structure of claim 16 further comprising a cover fitted over the frame.

19. The mounting structure of claim 12 wherein the first and second pivotal interfaces are generally coaxial.

20. The mounting structure of claim 12 wherein the first pivotal interface is configured to at least partially grip the first mounting interface of the display board.

21. The mounting structure of claim 12 wherein the second pivotal interface is disposed below the first pivotal interface.

* * * * *